United States Patent
Kigo et al.

(10) Patent No.: US 7,142,202 B2
(45) Date of Patent: Nov. 28, 2006

(54) DRIVING CIRCUIT AND DISPLAY DEVICE

(75) Inventors: Shigeo Kigo, Neyagawa (JP); Hidehiko Shoji, Osaka (JP); Jumpei Hashiguchi, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 187 days.

(21) Appl. No.: 10/625,873

(22) Filed: Jul. 24, 2003

(65) Prior Publication Data

US 2004/0070577 A1    Apr. 15, 2004

Related U.S. Application Data

(62) Division of application No. 09/868,660, filed as application No. PCT/JP00/07713 on Nov. 1, 2000, now Pat. No. 6,633,285.

(30) Foreign Application Priority Data

Nov. 9, 1999  (JP) ................. 11-317637
May 30, 2000  (JP) ................. 2000-160080

(51) Int. Cl.
G09G 3/36 (2006.01)
(52) U.S. Cl. .................. 345/205; 345/60; 315/169.4
(58) Field of Classification Search .............. 345/60, 345/87, 99, 204, 205, 208, 211, 212; 327/111, 327/404, 438; 315/169.1, 169.4
See application file for complete search history.

(56) References Cited

U.S. PATENT DOCUMENTS

| | | | |
|---|---|---|---|
| 4,707,692 A | 11/1987 | Higgins et al. | |
| 4,866,349 A | 9/1989 | Weber et al. | |
| 5,654,728 A | 8/1997 | Kanazawa et al. | |
| 5,786,794 A | 7/1998 | Kishi et al. | |
| 5,821,838 A * | 10/1998 | Suzuki et al. | 334/47 |
| 5,828,353 A | 10/1998 | Kishi et al. | |
| 5,962,993 A * | 10/1999 | Kashiwagi | 315/371 |
| 5,994,929 A | 11/1999 | Sano et al. | |
| 6,011,355 A | 1/2000 | Nagai | |
| 6,157,179 A * | 12/2000 | Miermans | 323/282 |
| 6,333,738 B1 | 12/2001 | Ide | |
| 6,366,063 B1 | 4/2002 | Sekii | |
| 6,448,950 B1 | 9/2002 | Cheng | |
| 2004/0125095 A1 | 7/2004 | Kigo et al. | |
| 2004/0125096 A1 | 7/2004 | Kigo et al. | |

FOREIGN PATENT DOCUMENTS

EP    0261584    3/1988

(Continued)

OTHER PUBLICATIONS

English Language Abstract of JP 11-85099.

(Continued)

*Primary Examiner*—Richard Hjerpe
*Assistant Examiner*—Abbas Abdulselam
(74) *Attorney, Agent, or Firm*—Greenblum & Bernstein, P.L.C.

(57) ABSTRACT

In a circuit driving a capacitive load Cp, current passed through a transistor Q3, a diode D1 and a recovering coil L is passed through lines L1, L2, and the inductance components of the lines L1 and L2, and the drain-source capacitances of the transistors Q1 and Q2 generate LC resonance. Capacitors C1 and C2 are connected in parallel to the drain-source regions of the transistors Q1 and Q2 to increase the total drain-source capacitance and reduce the resonance frequency, so that unwanted electromagnetic wave radiation in a frequency band affecting other electronic devices is suppressed.

18 Claims, 14 Drawing Sheets

FOREIGN PATENT DOCUMENTS

| | | |
|---|---|---|
| EP | 0810576 | 12/1997 |
| EP | 0261584 | 3/1998 |
| EP | 0948243 | 10/1999 |
| FR | 2762705 | 10/1998 |
| JP | 1-261923 | 10/1989 |
| JP | 2-029779 | 1/1990 |
| JP | 3-183211 | 8/1991 |
| JP | 5-315913 | 11/1993 |
| JP | 7-160219 | 6/1995 |
| JP | 8-23242 | 1/1996 |
| JP | 9-47013 | 2/1997 |
| JP | 9-325735 | 12/1997 |
| JP | 0-268831 | 10/1998 |
| JP | 10-268831 | 10/1998 |
| JP | 10-301530 | 11/1998 |
| JP | 11-85099 | 3/1999 |
| JP | 11-344948 | 12/1999 |
| JP | 3364066 | 10/2002 |
| JP | 7-160219 | 3/2004 |
| KR | 0235810 | 9/1999 |

OTHER PUBLICATIONS

English Language Abstract of JP 3-183211.
English Language Abstract of JP 10-268831.
English Language Abstract JP3-183211.
English Language Abstract JP8-23242.
English Language Abstract JP10-268831.
English Language Abstract JP 1-261923.
English Language Abstract JP5-315913.
English Language Abstract JP9-47013.
English Language Abstract of JP 11-344948.
English language Abstract of JP 10-301530.
"Circuit," Third Edition (Jan. 31, 1998), together with an English language translation thereof.
Lai, "Resonant Snubber-Based Soft-Switching Inverters for Electric Propulsion Drives," IEEE Transactions on Industrial Electronics, vol. 44, No. 1, Feb. 1997, pp. 71-80.

* cited by examiner

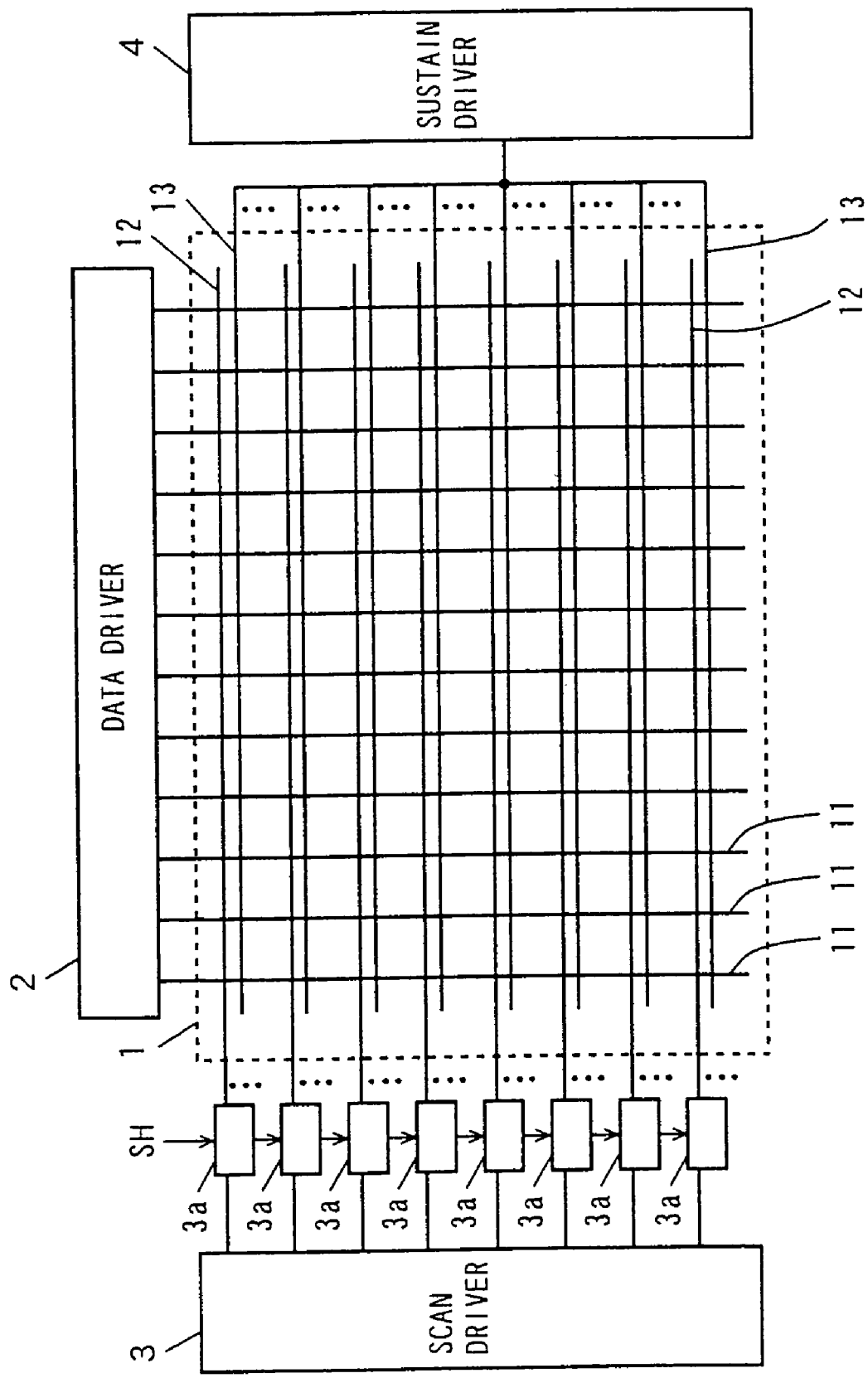

F I G. 1 3
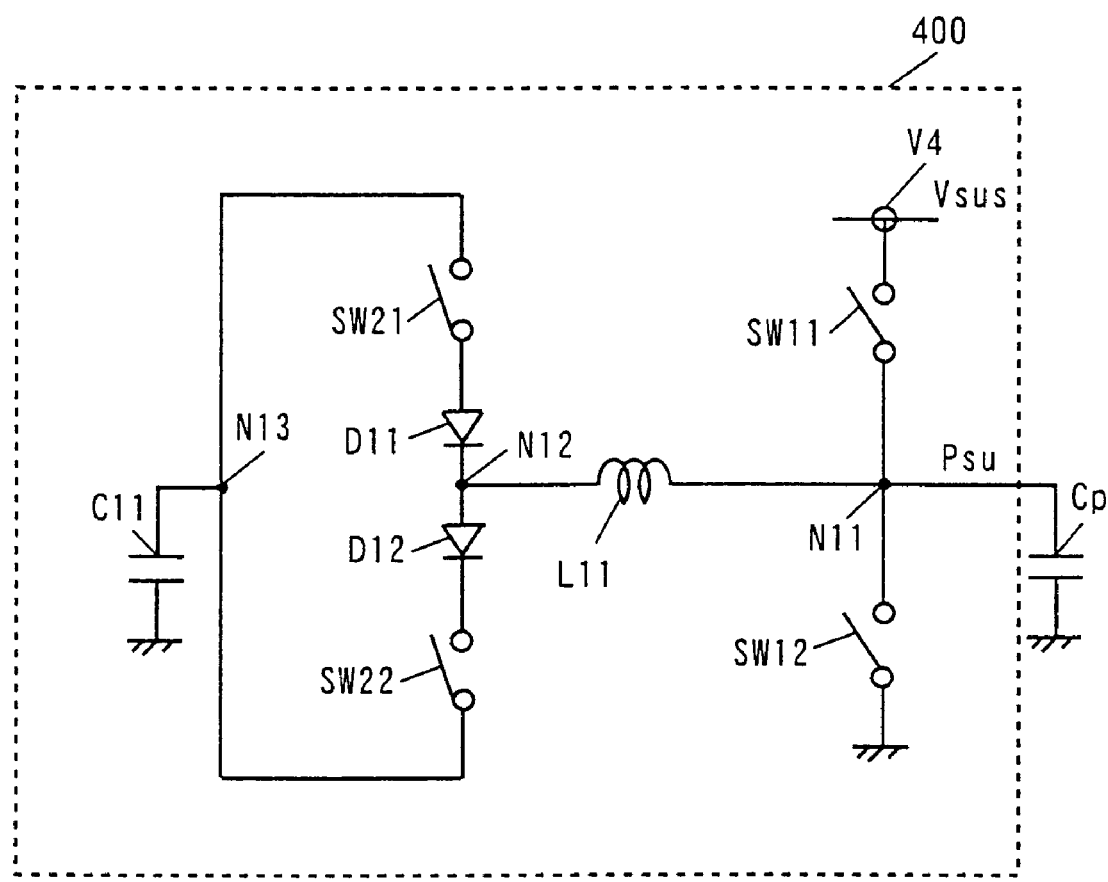

DRIVING CIRCUIT AND DISPLAY DEVICE

This is a division application for U.S. application Ser. No. 09/868,660, filed Jul. 5, 2001, now U.S. Pat. No. 6,633,285 which was the National Stage of International Application No. PCT/JP00/07713, filed Nov. 1, 2000, the contents of which are expressly incorporated by reference herein in its entirely. The International Application was not published under PCT Article 21(2) in English.

TECHNICAL FIELD

The present invention relates to a driving circuit to drive a capacitive load with a driving pulse, and a display device using the driving circuit.

BACKGROUND ART

A sustain driver to drive a sustain electrode in a plasma display panel for example is known as a conventional driving circuit to drive a capacitive load.

FIG. 13 is a circuit diagram showing the configuration of a conventional sustain driver. As shown in FIG. 13, the sustain driver 400 includes a recovering capacitor C11, a recovering coil L11, switches SW11, SW12, SW21, and SW22, and diodes D11 and D12.

The switch SW11 is connected between a power supply terminal V4 and a node N11, while the switch SW12 is connected between the node N11 and the ground terminal. The power supply terminal V4 is provided with voltage Vsus. The node N11 is connected to 480 sustain electrodes for example, and in FIG. 13 a panel capacitance Cp corresponding to the total capacitance between a plurality of sustain electrodes and the ground terminal is shown.

The recovering capacitor C11 is connected between a node N13 and the ground terminal. The switch SW21 and the diode D11 are connected in series between the nodes N13 and N12, and the diode D12 and the switch SW22 are connected in series between the nodes N12 and N13. The recovering coil L11 is connected between the nodes N12 and N11.

FIG. 14 is a timing chart for use in illustration of the operation of the sustain driver 400 in FIG. 13 during a sustain period. FIG. 14 shows the voltage at the node N11 and the operation of the switches SW21, SW11, SW22 and SW12 in FIG. 13.

At first, during the period Ta, the switch SW21 turns on, and the switch SW12 turns off. At the time, the switches SW11 and SW22 are both off. Thus, LC resonance by the recovering coil L11 and the panel capacitance Cp causes the voltage at the node N11 to gradually rise. During the period Tb, the switch SW21 turns off, and the switch SW11 turns on. Thus, the voltage at the node N11 abruptly increases, and the voltage at the node N11 is fixed at the level of Vsus during the period Tc.

During the period Td, the switch SW11 turns off, and the switch SW22 turns on. Thus, the LC resonance by the recovering coil L11 and the panel capacitance Cp causes the voltage at the node N11 to gradually decrease. Then, during the period Te, the switch SW22 turns off, and the switch SW12 turns on. Thus, the voltage at the node N11 abruptly drops, and is fixed at the ground potential level. The above operation is repeated during the sustain period, so that a periodic sustain pulse Psu is applied to the plurality of sustain electrodes.

As described above, the rising and falling parts of the sustain pulse Psu consist of the LC resonance part during the periods Ta and Td by the operation of the switch SW21 or SW22 and edge parts e1 and e2 during the periods Tb and Te by the turn-on operation of the switch SW11 or SW12.

These switches SW11, SW12, SW21 and SW22 are each composed of an FET (field effect transistor) serving as a switching element, and each FET has a drain-source capacitance as a parasitic capacitance, and a line connected to each FET has an inductance component. Therefore, when the switch SW11 or the like changes from an off state to an on state, LC resonance is generated by the drain-source capacitance and the inductance component of the lines, and the LC resonance causes unwanted electromagnetic wave radiation.

The diodes D11 and D12 each have an anode-cathode capacitance as a parasitic capacitance, and a line connected to each diode has an inductance component. Therefore, when the switch SW11 or the like changes from an off state to an on state, LC resonance is generated by the anode-cathode capacitance and the inductance component of the lines, and the LC resonance causes unwanted electromagnetic wave radiation.

Furthermore, the drain-source capacitance of each FET, the anode-cathode capacitance of each diode and the inductance component of each line are small, so that the LC resonance frequency is high, and the frequency of the resultant electromagnetic wave is also high. Meanwhile, according to the standard for unwanted radiation defined by the Electrical Appliance and Material Control Law (Federal Communications Commission (FCC) in the United States), a limit value is set for an electromagnetic wave having a frequency of 30 MHz or higher. As a result, the radiation of such a high frequency electromagnetic wave could have an electromagnetically adverse effect on other electronic devices, and therefore the radiation of such an unwanted, high frequency electromagnetic wave should be suppressed.

DISCLOSURE OF THE INVENTION

It is an object of the present invention to provide a driving circuit allowing unwanted high frequency electromagnetic wave radiation to be suppressed and a display device using the driving circuit.

A driving circuit according to one aspect of the present invention outputs a driving pulse to drive a capacitive load and includes an electrical circuit connected to a pulse supply path for supplying the driving pulse to the capacitive load, an interconnection portion connected to the electrical circuit and a frequency reducing circuit for reducing the resonance frequency of LC resonance by the parasitic capacitance of the electrical circuit and the inductance component of the interconnection portion.

In the driving circuit, the resonance frequency of the LC resonance by the parasitic capacitance of the electrical circuit connected to the pulse supply path for supplying the driving pulse to the capacitive load and the inductance component of the interconnection portion is reduced, so that the frequency of electromagnetic waves generated by the LC resonance can be reduced, and unwanted high frequency electromagnetic wave radiation can be suppressed.

The electrical circuit preferably includes a switching circuit for applying the driving pulse to the capacitive load.

In this case, the resonance frequency of the LC resonance by the parasitic capacitance of the switching circuit for applying the driving pulse to the capacitive load and the inductance component of the interconnection portion is reduced, so that the frequency of electromagnetic waves generated by the LC resonance can be reduced, and unwanted high frequency electromagnetic wave radiation can be suppressed.

The capacitive load preferably includes a discharge cell having a plurality of electrodes, and the switching circuit preferably includes a sustain pulse switching circuit for applying a sustain pulse to the capacitive load during a sustain period for lighting the discharge cell.

In this case, the resonance frequency of the LC resonance by the parasitic capacitance of the sustain pulse switching circuit for applying a sustain pulse to the capacitive load during a sustain period to light the discharge cell and the inductance component of the interconnection portion is reduced, the frequency of electromagnetic waves generated by the LC resonance during the sustain period can be reduced, and unwanted high frequency electromagnetic wave radiation can be suppressed.

The capacitive load preferably includes a discharge cell having a plurality of electrodes, and the switching circuit preferably includes an initialization pulse switching circuit for applying an initialization pulse to the capacitive load during an initialization period for adjusting wall charges at the electrodes of the discharge cell.

In this case, the resonance frequency of the LC resonance by the parasitic capacitance of the initialization pulse switching circuit for applying an initialization pulse to the capacitive load during an initialization period for adjusting wall charges at the discharge cell and the inductance component of the interconnection portion is reduced, so that in the driving circuit for apply the initialization pulse, the frequency of electromagnetic waves generated by the LC resonance during the sustain period can be reduced, and unwanted high frequency electromagnetic wave radiation can be suppressed.

The switching circuit preferably includes a field effect transistor.

In this case, the resonance frequency of LC resonance resulting from the drain-source capacitance of the field effect transistor can be reduced.

The electrical circuit preferably includes a protection circuit for preventing overvoltage from being applied to other electrical elements.

In this case, the resonance frequency of LC resonance by the parasitic capacitance of the protection circuit for preventing overvoltage from being applied on other electrical elements and the inductance component of the interconnection portion is reduced, so that the frequency of electromagnetic waves generated by the LC resonance can be reduced, and unwanted high frequency electromagnetic wave radiation can be suppressed.

The protection circuit preferably includes a diode.

In this case, the resonance frequency of LC resonance resulting from the anode-cathode capacitance of the diode can be reduced.

The frequency reducing circuit preferably reduces the resonance frequency of the LC resonance to a level less than 30 MHz.

In this case, the resonance frequency of the LC resonance is reduced to a level less than 30 MHz and therefore electromagnetic wave radiation at a frequency of 30 MHz or higher can be suppressed.

The frequency reducing circuit preferably includes a capacitive element connected in parallel to the electrical circuit.

In this case, the capacitance of the capacitive element is added in parallel to the parasitic capacitance of the electrical circuit, which increases the capacitance in the LC resonance path and therefore the resonance frequency of the LC resonance can be reduced.

The driving circuit preferably further includes a voltage source for supplying prescribed voltage, and the switching circuit preferably has one end connected to the voltage source and the other end connected to the interconnection portion.

In this case, the voltage supplied from the voltage source is applied to the capacitive load through the switching circuit and the interconnection portion and the capacitive load can be driven by the voltage, so that the resonance frequency of the LC resonance can be reduced at the time of application of the driving pulse, and unwanted high frequency electromagnetic wave radiation can be suppressed.

Preferably, the voltage source includes a first voltage source for supplying first voltage for causing the driving pulse to rise and a second voltage source for supplying a second voltage lower than the first voltage for causing the driving pulse to fall, the switching circuit includes a first switching element having one end connected to the first voltage source and a second switching element having one end connected to the second voltage source, the interconnection portion includes a first interconnection portion having one end connected to the other end of the first switching element and a second interconnection portion having one end connected to the other end of the second switching element and the other end connected to the other end of the first interconnection portion, the frequency reducing circuit includes a first capacitive element connected in parallel to the first switching element and a second capacitive element connected in parallel to the second switching element.

In this case, the first voltage can be supplied through the first switching element and the first interconnection portion to cause the driving pulse to rise, and the second voltage can be supplied through the second switching element and the second interconnection portion to cause the driving pulse to fall. The capacitance in the LC resonance path increases by the first and second capacitive elements, and therefore the resonance frequency of the LC resonance by the switching elements and the interconnection portion can be reduced. As a result, the driving pulse is allowed to rise and fall, while the resonance frequency of the LC resonance can be reduced, and unwanted high frequency electromagnetic wave radiation can be suppressed.

Preferably, the driving circuit further includes an inductance element having one end connected to the capacitive load and a recovering capacitive element for recovering charges from the capacitive load, the switching circuit includes a one-way conductive element having one end connected to the other end of the inductance element and a switching element having one end connected to the other end of the one-way conductive element, the interconnection portion has one end connected to the other end of the switching element and the other end connected to one end of the recovering capacitive element, and the frequency reducing circuit includes a capacitive element connected in parallel to the switching element.

In this case, the driving pulse is allowed to rise and fall by LC resonance by the inductance element and the capacitive load, while charges can be recovered from the recovering capacitive element, and therefore the power consumption by the driving circuit can be reduced. The capacitance in the LC resonance path increases by the capacitive element, so that the resonance frequency of the LC resonance by the switching element and the interconnection portion can be reduced, and unwanted high frequency electromagnetic wave radiation can be suppressed.

Preferably, the driving circuit further includes an inductance element having one end connected to the capacitive load and a recovering capacitive element for recovering charges from the capacitive load, the switching circuit includes a switching element having one end connected to one end of the recovering capacitive element and a one-way conductive element having one end connected to the other end of the switching element, the interconnection portion has one end connected to the other end of the one-way conductive element and the other end connected to the other end of the inductance element, and the frequency reducing circuit includes a capacitive element connected in parallel to the one-way conductive element.

In this case, the driving pulse is allowed to rise and fall by the LC resonance by the inductance element and the capacitive load, while charges can be recovered by the recovering capacitive element, so that the power consumption by the driving circuit can be reduced. The capacitance in the LC resonance path increases by the capacitive element, so that the resonance frequency of the LC resonance by the one-way conductive element and the interconnection portion can be reduced and unwanted high frequency electromagnetic wave radiation can be suppressed.

Preferably, the driving circuit further includes a voltage source for supplying prescribed voltage, an inductance element having one end connected to the capacitive load, a recovering capacitive element for recovering charges from the capacitive load and a connection circuit for connecting the recovering capacitive element and the inductance element, the protection circuit includes a one-way conductive element having one end connected to the voltage source and the other end connected to one end of the connection circuit on the inductance element side, and the frequency reducing circuit includes a capacitive element connected in parallel to the one-way conductive element.

In this case, the one-way conductive element can prevent overvoltage from being supplied to the connection circuit from the voltage source. The driving pulse is allowed to rise or fall by LC resonance by the inductance element and the capacitive load, while charges can be recovered from the capacitive load by the recovering capacitive load, so that the power consumption by the driving circuit can be reduced. Furthermore, the capacitance in the LC resonance path increases by the capacitive element, so that the resonance frequency of the LC resonance by the one-way conductive element and the interconnection portion can be reduced, and unwanted high frequency electromagnetic wave radiation can be suppressed.

A display device according to another aspect of the present invention includes a display panel including a plurality of capacitive loads composed of a plurality of electrodes and a driving circuit outputting a driving pulse to drive the capacitive load in the display panel, the driving circuit includes an electrical circuit connected to a pulse supply path for supplying the driving pulse to the capacitive load, an interconnection portion connected to the electrical circuit and a frequency reducing circuit for reducing the resonance frequency of LC resonance by the parasitic capacitance of the electrical circuit and the inductance component of the interconnection portion.

In the display device, the resonance frequency of the LC resonance by the parasitic capacitance of the electrical circuit connected to the pulse supply circuit for supplying the driving pulse to the capacitive load and the inductance component of the interconnection portion is reduced, so that if the plurality of capacitive loads in the display panel are driven, unwanted high frequency electromagnetic wave radiation from the driving circuit can be suppressed and unwanted high frequency electromagnetic waves generated by the display device can be suppressed from being radiated.

The electrical circuit preferably includes a switching circuit for applying the driving pulse to the capacitive load.

In this case, the resonance frequency of the LC resonance by the parasitic capacitance of the switching circuit for applying the driving pulse to the capacitive load and the inductance component of the interconnection portion is reduced, so that the frequency of electromagnetic waves generated by the LC resonance can be reduced and unwanted high frequency electromagnetic wave radiation can be suppressed.

The capacitive load preferably includes a discharge cell composed of the plurality of electrodes, and the switching circuit preferably includes a sustain pulse switching circuit for applying a sustain pulse to the capacitive load during a sustain period for lighting the discharge cell.

In this case, the resonance frequency of the LC resonance by the parasitic capacitance of the sustain pulse switching circuit for applying a sustain pulse to the capacitive load during a sustain period for lighting the discharge cell and the inductance component of the interconnection portion is reduced, so that the frequency of electromagnetic waves generated by the LC resonance during the sustain period can be reduced, and unwanted high frequency electromagnetic wave radiation from the display device can be suppressed.

The capacitive load preferably includes a discharge cell composed of the plurality of electrodes, and the switching circuit preferably includes an initialization pulse switching circuit for applying an initialization pulse to the capacitive load during an initialization period for adjusting wall charges at the electrodes of the discharge cell.

In this case, the resonance frequency of the LC resonance by the parasitic capacitance of the initialization pulse switching circuit for applying an initialization pulse to the capacitive load during an initialization period for adjusting wall charges at the electrodes of the discharge cell and the inductance component of the interconnection portion is reduced, so that in the driving circuit for applying the initialization pulse, the frequency of electromagnetic waves generated by the LC resonance during a sustain period can be reduced, and unwanted high frequency electromagnetic wave radiation can be suppressed.

The electrical circuit preferably includes a protection circuit for preventing an overvoltage from being applied to other electrical elements.

In this case, the resonance frequency of the LC resonance by the parasitic capacitance of the protection circuit for preventing an overvoltage from being applied on other electrical elements and the inductance component of the interconnection portion is reduced, so that the frequency of electromagnetic waves generated by the LC resonance can be reduced and unwanted high frequency electromagnetic wave radiation generated by the display device can be suppressed.

The frequency reducing circuit reduces the resonance frequency of the LC resonance to a level less than 30 MHz.

In this case, the resonance frequency of the LC resonance is reduced to a level less than 30 MHz and therefore electromagnetic wave radiation at 30 MHz or higher generated by the display device can be suppressed.

BRIEF DESCRIPTION OF THE DRAWINGS

FIG. 1 is a block diagram showing the configuration of a plasma display device using a sustain driver according to a first embodiment of the present invention;

FIG. 13 is a circuit diagram showing the configuration of a conventional sustain driver.

BEST MODES FOR CARRYING OUT THE INVENTION

Figure 2:
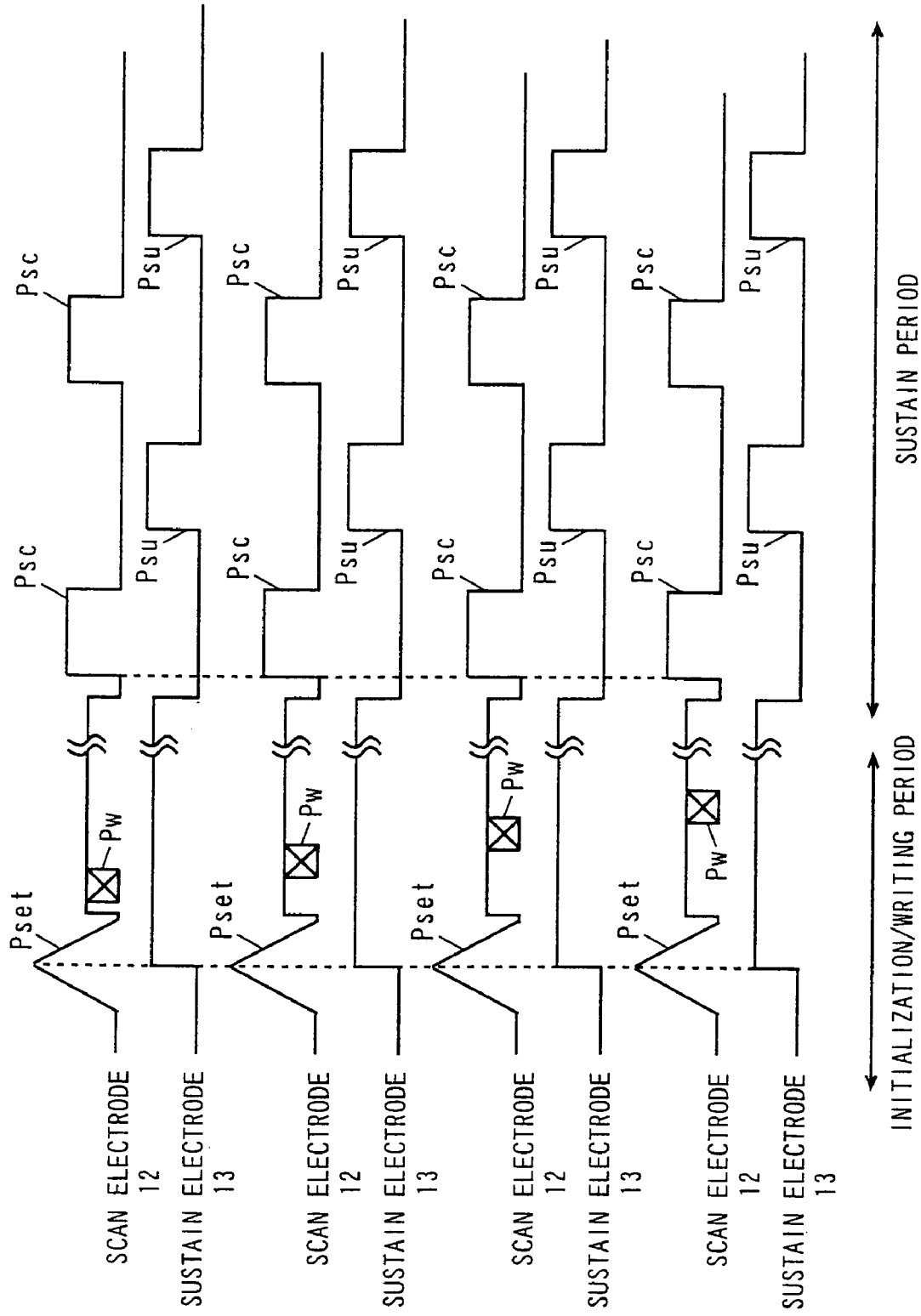
FIG. 2 is a timing chart showing an example of driving voltage for a scan electrode and a sustain electrode in the PDP shown in FIG. 1.

A sustain driver used in a plasma display device will be now described as an example of a driving circuit according to the present invention. Note that the driving circuit according to the present invention may similarly be applied to any other devices driving a capacitive load, for example as a driving circuit for a display such as a plasma display panel, a liquid crystal display, and an electroluminescence display. The driving circuit according to the present invention may be applied to a driving circuit for plasma display panels of both AC and DC types, and is applicable to a driving circuit for any of an address electrode, a sustain electrode, and a scan electrode, while it can suitably be applied to a driving circuit for a sustain electrode or a scan electrode.

FIG. 1 is a block d ram showing the configuration of a plasma display device using a sustain driver according to a first embodiment of the present invention.

The plasma display device in FIG. 1 includes a PDP (plasma display panel) 1, a data driver 2, a scan driver 3, a plurality of scan driver ICs (circuits) 3a and a sustain driver 4.

The PDP 1 includes a plurality of address electrodes (data electrodes) 11, a plurality of scan electrodes 12, and a plurality of sustain electrodes 13. The plurality of address electrodes 11 are arranged in the vertical direction on the screen, while the plurality of scan electrodes 12 and the plurality of sustain electrodes 13 are arranged in the horizontal direction on the screen. The plurality of sustain electrodes 13 are connected together. A discharge cell is formed at each of the intersecting points of the address electrodes 11, the scan electrodes 12 and the sustain electrodes 13 and each discharge cell forms a pixel on the screen.

The data driver 2 is connected to the plurality of address electrodes 11 in the PDP 1. The plurality of scan driver ICs 3a are connected to the scan driver 3. The scan driver ICs 3a are connected with the plurality of scan electrodes 12 in the PDP 1. The sustain driver 4 is connected with the plurality of sustain electrodes 13 in the PDP 1.

The data driver 2 applies a writing pulse to a corresponding address electrode 11 in PDP 1 based on image data during a writing period. The plurality of scan driver ICs 3a are driven by the scan driver 3 to sequentially apply the writing pulse to the plurality of scan electrodes 12 in PDP 1 during the writing period while shifting a shift pulse SH in the vertical scanning direction. Thus, address discharge takes place at a corresponding discharge cell.

The plurality of scan driver ICs 3a apply a periodic sustain pulse to the plurality of scan electrodes 12 in the PDP 1 during a sustain period. Meanwhile, the sustain driver 4 applies sustain pulse 180° out of phase with the sustain pulse to the scan electrode 12 to the plurality of sustain electrodes 13 in the PDP 1 at a time during a sustain period. Thus, sustain discharge takes place at a corresponding discharge cell.

FIG. 2 is a timing chart showing an example of the driving voltage at the scan electrode 12 and the sustain electrode 13 in the PDP 1 in FIG. 1.

During an initialization/writing period, an initialization pulse (setup pulse) Pset is applied to the plurality of scan electrodes 12 at a time. Thereafter, a writing pulse Pw is sequentially applied to the plurality of scan electrodes 12. Thus, address discharge takes place at a corresponding discharge cell in the PDP 1.

Then during a sustain period, a sustain pulse Psc is periodically applied to the plurality of scan electrodes 12, and the sustain pulse Psu is periodically applied to the plurality of sustain electrodes 13. The phase of the sustain pulse Psu is 180° shifted from the phase of the sustain pulse Psc. Thus, sustain discharge takes place following the address discharge.

Figure 3:
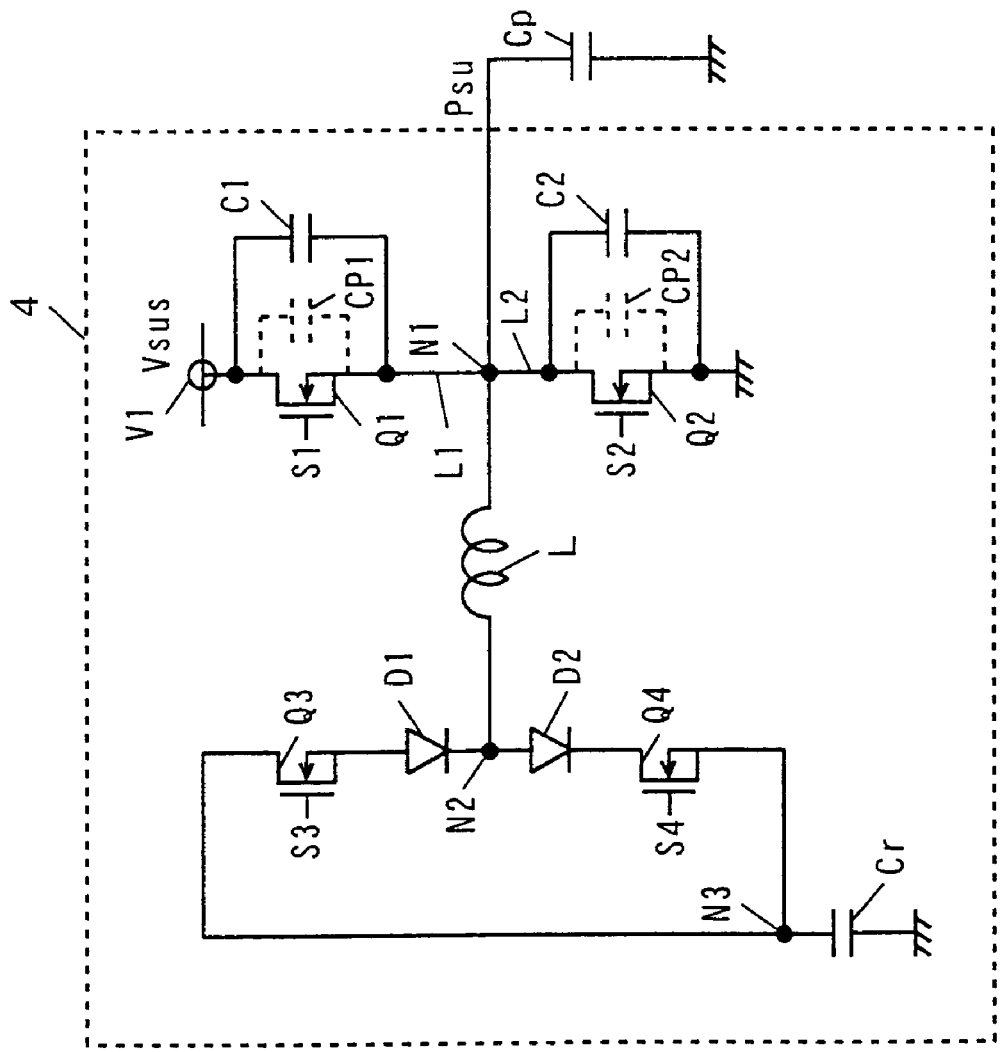
FIG. 3 is a circuit diagram showing the configuration of the sustain driver shown in FIG. 1 according to the first embodiment of the present invention.

The sustain driver 4 shown in FIG. 1 will be now described. FIG. 3 is a circuit diagram showing the configuration of the sustain driver 4 in FIG. 1.

The sustain driver 4 in FIG. 3 includes n-channel type FETs (field effect transistors; hereinafter simply as "transistors") Q1 to Q4 as switching elements, capacitors C1 and C2, a recovering capacitor Cr, a recovering coil L and diodes D1 and D2.

The transistor Q1 has one end connected to a power supply terminal V1 and the other end connected to a node N1 through a line L1, and is provided with a control signal S1 as an input at its gate. The transistor Q1 has a drain-source capacitance CP1 as a parasitic capacitance, and the capacitor C1 is connected in parallel to the drain-source region of the transistor Q1. The voltage Vsus is applied to the power supply terminal V1.

The transistor Q2 has one end connected to the node N1 through a line L2 and the other end connected to the ground terminal and is provided with a control signal S2 as an input at its gate. The transistor Q2 has a drain-source capacitance CP2 as a parasitic capacitance and the capacitor C2 is connected in parallel to the drain-source region of the transistor Q2.

The node N1 is connected to 480 sustain electrodes 13 for example, while in FIG. 3 a panel capacitance Cp corresponding to the total capacitance between the plurality of sustain electrodes 13 and the ground terminal is shown.

The recovering capacitor Cr is connected between a node N3 and the ground terminal. The transistor Q3 and the diode D1 are connected in series between the nodes N3 and N2. The diode D2 and transistor Q4 are connected in series between the nodes N2 and N3. A control signal S3 is input to the gate of the transistor Q3, while a control signal S4 is input to the gate of the transistor Q4. The recovering coil L is connected between the nodes N2 and N1.

According to the embodiment, the transistors Q1 and Q2 correspond to the electrical circuit, the switching circuit and the sustain pulse switching circuit, the lines L1 and L2 to the interconnection portion, the capacitors C1 and C2 to the frequency reducing circuit, and the power supply terminal V1 and the ground terminal to the voltage source. The transistor Q1 corresponds to the first switching element, the transistor Q2 to the second switching element, the line L1 to the first interconnection portion, the line L2 to the second interconnection portion, the capacitor C1 to the first capacitive element, the capacitor C2 to the second capacitive element, the power supply terminal V1 to the first voltage source and the ground terminal to the second voltage source.

The operation of the sustain driver 4 having the above-described configuration during a sustain period will be now described.

When the control signal S2 attains a low level, the transistor Q2 turns off, while when the control signal S3 attains a high level, the transistor Q3 turns on. At the time, the control signal S1 is at a low level, and the transistor Q1 is in an off state, while the control signal S4 is at a low level, and the transistor Q4 is in an off state. Therefore, the recovering capacitor Cr is connected to the recovering coil L through the transistor Q3 and the diode D1, and LC resonance by the recovering coil L and the panel capacitance Cp causes the voltage at the node N1 to gradually rise. At the time, charges from the recovering capacitor Cr are discharged to the panel capacitance Cp through the transistor Q3, the diode D1 and the recovering coil L.

Also at this time, current passed across the transistor Q3, the diode D1 and the recovering coil L comes not only into the panel capacitance Cp but also to the drain-source capacitance CP1 of the transistor Q1 and the capacitor C1 through the line L1 and to the drain-source capacitance CP2 of the transistor Q2 and the capacitor C2 through the line L2. Therefore, the inductance components of the lines L1 and L2 and the drain-source capacitances CP1 and CP2 of the transistor Q1 and Q2 and the capacitors C1 and C2 generate LC resonance.

However in the embodiment, the capacitance contributing to the LC resonance is a capacitance produced by adding the source-drain capacitances CP1 and CP2 and the capacitors C1 and C2, and therefore the resonance frequency is lower than the resonance frequency only by the drain-source capacitances CP1 and CP2. More specifically, the capacitances of the capacitors C1 and C2 are set to be for example about five to ten times as much as those of the drain-source capacitances CP1 and CP2 of the transistors Q1 and Q2 so that the resonance frequency of the LC resonance is less than 30 MHz.

Figure 4:
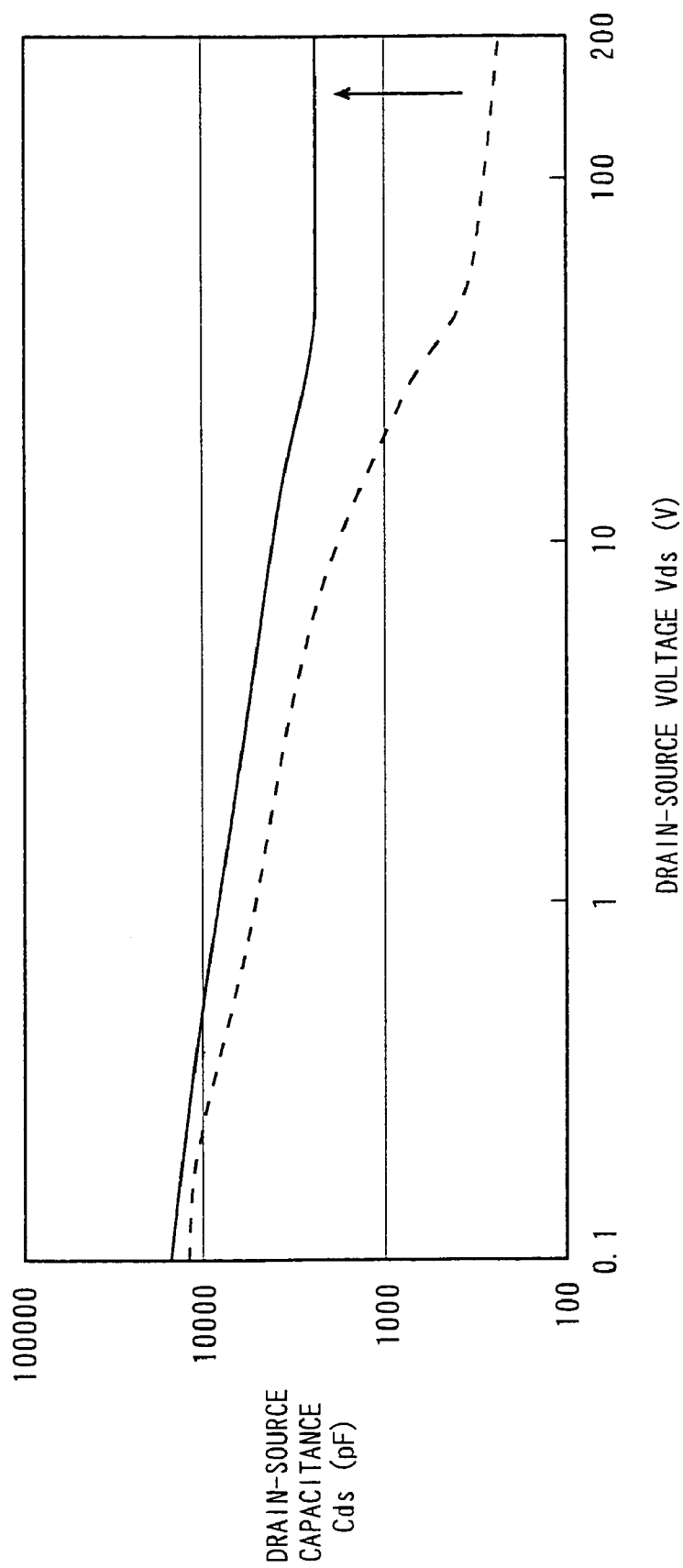
FIG. 4 is a graph representing the relation of the drain-source voltage and capacitance between the case of connecting a capacitor to the drain-source region of an FET and the case of not connecting the capacitor.

Now, a capacitor with 2000 pF is connected in parallel to the drain-source region of an FET and the relation between the drain-source capacitance and the drain-source voltage will be described. FIG. 4 is a graph representing the relation between the drain-source capacitance Cds (pF) and the drain-source voltage Vds (V), showing the case of connecting the capacitor with 2000 pF in parallel to the FET and the case of not connecting. In FIG. 4, the case of not connecting the capacitor with 2000 pF to the drain-source region of the FET is denoted by the broken line and the case of connecting the capacitor with 2000 pF in parallel is denoted by the solid line.

As shown in FIG. 4, when the capacitor with 2000 pF is connected in parallel to the source-drain region of the FET, the drain-source capacitance Cds increases as compared to the case of not connecting. In the embodiment, the drain-source voltage Vds in the transistors Q1 and Q2 in FIG. 3 is about 200V, and the capacitor with 2000 pF is connected in parallel to the drain-source region of each of the transistors Q1 and Q2, so that the drain-source capacitance Cds in each of the transistors Q1 and Q2 is about ten times higher than that in the case of not connecting the capacitor.

As described above, the capacitors C1 and C2 are connected in parallel to the drain-source regions of the transistors Q1 and Q2, respectively, so that the resonance frequency of the LC resonance generated at the time of transition of the transistor Q3 from an off state to an on state by the inductance components of the lines L1 and L2 and the drain-source capacitances CP1 and CP2 in the transistors Q1 and Q2 and the capacitors C1 and C2 is less than 30 MHz and therefore, unwanted electromagnetic wave radiation at 30 MHz or higher is suppressed.

Then, the control signal S1 attains a high level, which turns on the transistor Q1, and the control signal S3 attains a low level, which turns off the transistor Q3. Therefore, the node N1 is connected to the power supply terminal V1 and the voltage at the node N1 abruptly increases, and is fixed at the level of the voltage Vsus.

At the time, current passed from the power supply terminal V1 through the transistor Q1 comes not only into the panel capacitance Cp but also into the drain-source capacitance CP2 of the transistor Q2 and the capacitor C2 through the lines L1 and L2. Therefore, the inductance components of the lines L1 and L2, and the drain-source capacitance CP2 of the transistor Q2 and the capacitor C2 generate LC resonance.

Also in this case, similarly to the above, the capacitance contributing to the LC resonance is produced by adding the drain-source capacitance CP2 and the capacitor C2 and therefore, the resonance frequency of the LC resonance by the inductance components of the lines L1 and L2 and the drain-source capacitance CP2 of the transistor Q2 and the capacitor C2 generated at the time of the transition of the transistor Q1 from an off state to an on state is less than 30 MHz, so that unwanted electromagnetic wave radiation at 30 MHz or higher is suppressed.

Then, the control signal S1 attains a low level, which turns off the transistor Q1, while the control signal S4 attains a high level, which turns on the transistor Q4. As a result, the recovering capacitor Cr is connected to the recovering coil L through the diode D2 and the transistor Q4, and LC resonance by the recovering coil L and the panel capacitance Cp causes the voltage at the node N1 to be gradually reduced. At the time, charges accumulated at the panel capacitance Cp are stored in the recovering capacitor Cr through the recovering coil L, the diode D2 and the transistor Q4 for recovering the charges.

Also at this time, current passed from the panel capacitance Cp comes not only into the recovering capacitance Cr through the recovering coil L, the diode D2 and the transistor Q4, but also into the drain-source capacitances CP1 and CP2 of the transistors Q1 and Q2 and the capacitors C1 and C2 through the lines L1 and L2. Therefore, the inductance components of the lines L1 and L2 and the drain-source capacitances CP1 and CP2 of the transistors Q1 and Q2 and the capacitors C1 and C2 generate LC resonance.

Also in this case, similarly to the above case, the capacitance contributing to the LC resonance is produced by adding the drain-source capacitances CP1 and CP2 and the capacitors C1 and C2, and therefore the resonance frequency of the LC resonance generated at the time of transition of the transistor Q4 from an off state to an on state by the inductance components of the lines L1 and L2 and the drain-source capacitances CP1 and CP2 of the transistors Q1 and Q2 and the capacitors C1 and C2 is less than 30 MHz, so that unwanted electromagnetic wave radiation at 30 MHz or higher is suppressed.

Then, the control signal S2 attains a high level, which turns on the transistor Q2, while the control signal S4 attains a low level, which turns off the transistor Q4. Therefore, the node N1 is connected to the ground terminal and the voltage at the node N1 abruptly drops and is fixed at the level of the ground potential.

At the time, current passed to the ground terminal through the transistor Q2 comes not only from the panel capacitance Cp, but also from the drain-source capacitance CP1 of the transistor Q1 and the capacitor C1 through the lines L1 and L2. Therefore, the inductance components of the lines L1 and L2 and the drain-source capacitance CP1 and the capacitor C1 generate LC resonance.

Also in this case, similarly to the above, the capacitance contributing to the LC resonance is produced by adding the drain-source capacitance CP1 and the capacitor C1, and the resonance frequency of LC resonance by the inductance components of the lines L1 and L2 and the drain-source capacitance CP1 of the transistor Q1 and the capacitor C1 generated at the time of transition of the transistor Q2 from an off state to an on state is less than 30 MHz, so that unwanted electromagnetic wave radiation at 30 MHz or higher is suppressed.

Figure 14:
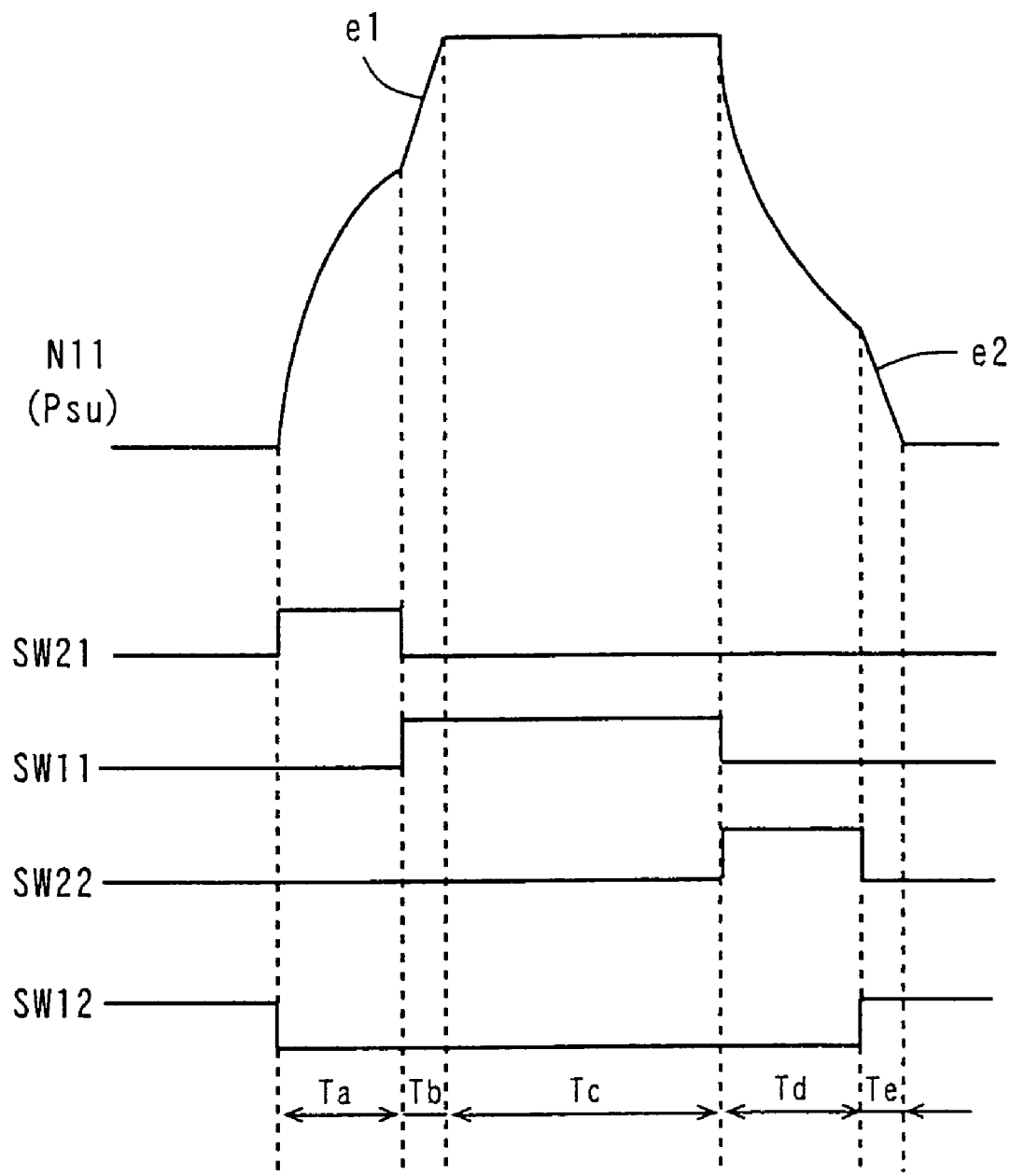
FIG. 14 is a timing chart for use in illustration of the operation of the sustain driver in FIG. 13 during a sustain period.

The above operation is repeated during a sustain period, so that a sustain pulse Psu having a waveform identical to the conventional sustain pulse Psu in FIG. 14 is periodically applied to the plurality of sustain electrodes 13 and unwanted electromagnetic wave radiation at 30 MHz or higher is suppressed.

Figure 5:
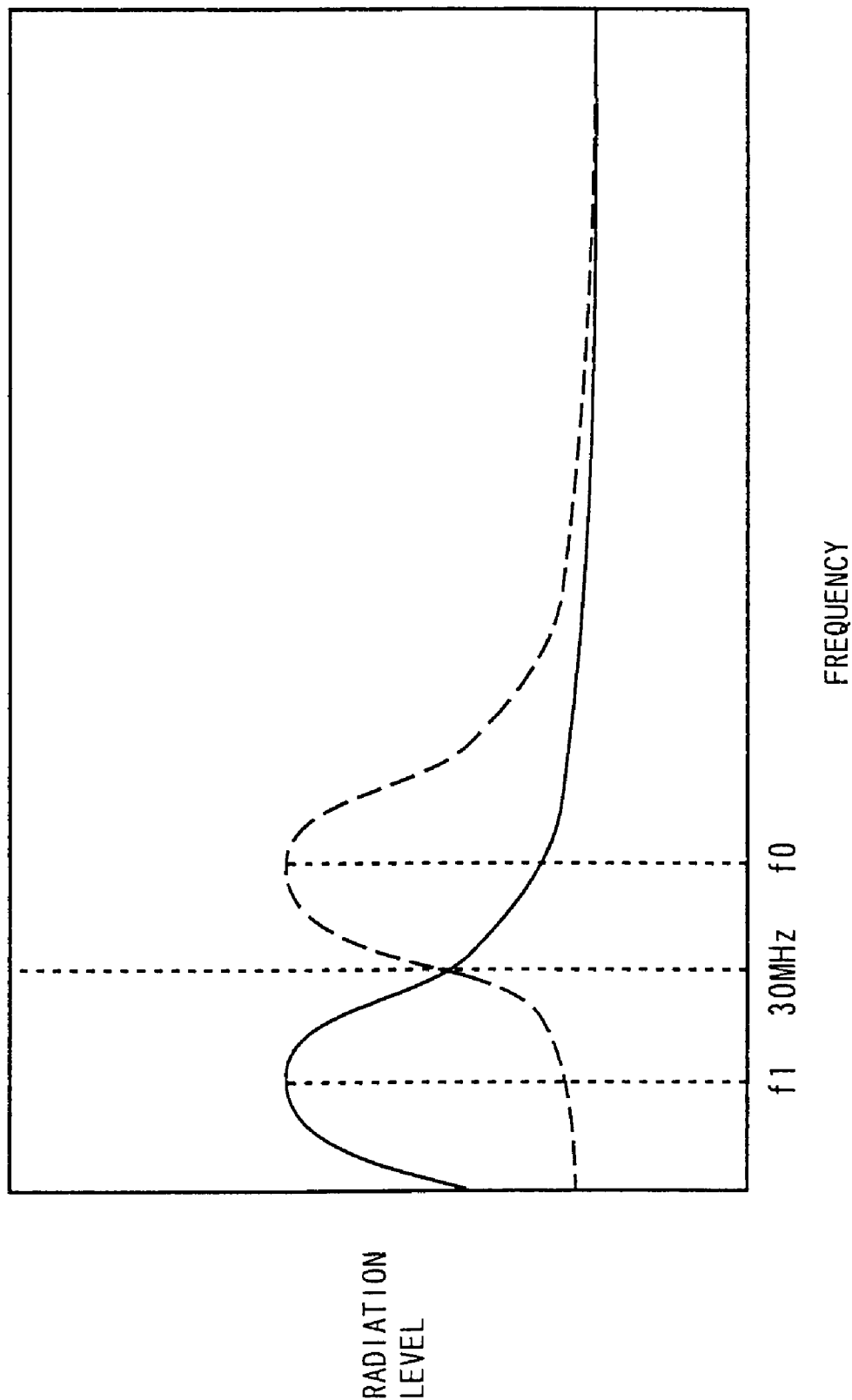
FIG. 5 is a graph representing the relation between the radiation level and the frequency of an electromagnetic wave emitted from the plasma display device shown in FIG. 1.

The radiation level reducing effect in the above parallel connection arrangement of transistors Q1 and Q2 and capacitors C1 and C2 will be now described. FIG. 5 is a graph representing the relation between the radiation level and the frequency of electromagnetic waves emitted from the plasma display device shown in FIG. 1. In FIG. 5, the case of connecting the capacitors C1 and C2 in parallel to the drain-source regions of the transistors Q1 and Q2, respectively is represented by the solid line, while the case of not connecting the capacitors C1 and C2 is represented by the broken line.

As can be seen from FIG. 5, when the capacitors C1 and C2 are not connected, the radiation level of electromagnetic waves is at the peak at a frequency f0 higher than 30 MHz, and the radiation level of the electromagnetic wave at 30 MHz or more is high. Meanwhile, when the capacitors C1 and C2 are connected in parallel to the drain-source regions of the transistors Q1 and Q2, the resonance frequency is reduced from f0 to f1, and the peak is located at f1 lower than 30 MHz. Therefore, the radiation level of electromagnetic waves at 30 MHz or higher can be sufficiently reduced and unwanted high frequency electromagnetic wave radiation at 30 MHz or higher can sufficiently be suppressed.

As described above, according to the embodiment, since the capacitors C1 and C2 are connected in parallel to the drain-source regions of the transistors Q1 and Q2, the resonance frequency of LC resonance generated at the time of the transition of the transistors Q1 to Q4 from an off state to an on state can be shifted to a low frequency less than 30 MHz. As a result, high frequency electromagnetic wave radiation at 30 MHz or higher can be suppressed.

Figure 6:
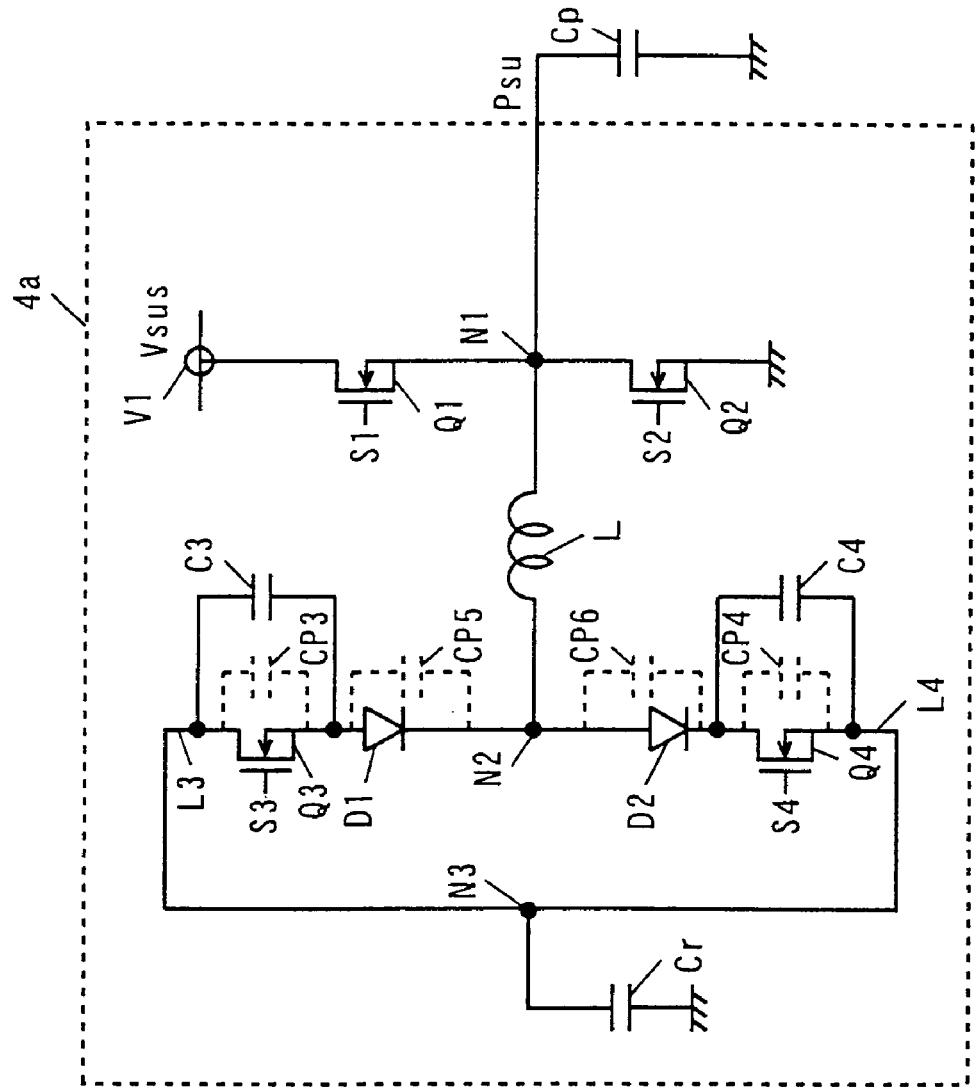
FIG. 6 is a circuit diagram showing the configuration of a sustain driver according to a second embodiment of the present invention.

Other sustain drivers used as the sustain driver 4 in FIG. 1 will be now described. FIG. 6 is a circuit diagram showing the configuration of a sustain driver according to a second embodiment of the invention.

The sustain driver 4a in FIG. 6 is different from the sustain driver 4 in FIG. 3 in that the capacitors C1 and C2 are not provided, and there are additional capacitors C3 and C4 connected in parallel to the transistors Q3 and Q4. The other part is the same as that of the sustain driver 4 shown in FIG. 3, and therefore the same portions are denoted by the same reference characters and are not detailed.

As shown in FIG. 6, the capacitor C3 is connected in parallel to the drain-source region of the transistor Q3, while the capacitor C4 is connected in parallel to the drain-source region of the transistor Q4. The transistor Q3 has one end connected to the node N3 through the line L3, while the transistor Q4 has one end connected to the node N3 through the line L4. Note that the lines L3 and L4 generically represent all the lines at the drain-source regions of the transistors Q3 and Q4. The transistor Q3 has a drain-source capacitance CP3 as a parasitic capacitance, and the transistor Q4 has a drain-source capacitance CP4 as a parasitic capacitance. The diode D1 has an anode-cathode capacitance CP5 as a parasitic capacitance, and the diode D2 has an anode-cathode capacitance CP6 as a parasitic capacitance.

According to the embodiment, the transistors Q3 and Q4 correspond to the electrical circuit, the switching circuit and the sustain pulse switching circuit, the lines L3 and L4 to the interconnection portion, the capacitors C3 and C4 to the frequency reducing circuit, the recovering coil L to the inductance element, the recovering capacitor Cr to the recovering capacitive element, the diodes D1 and D2 to the one-way conductive element, and the transistors Q3 and Q4 to the switching element.

Figure 7:
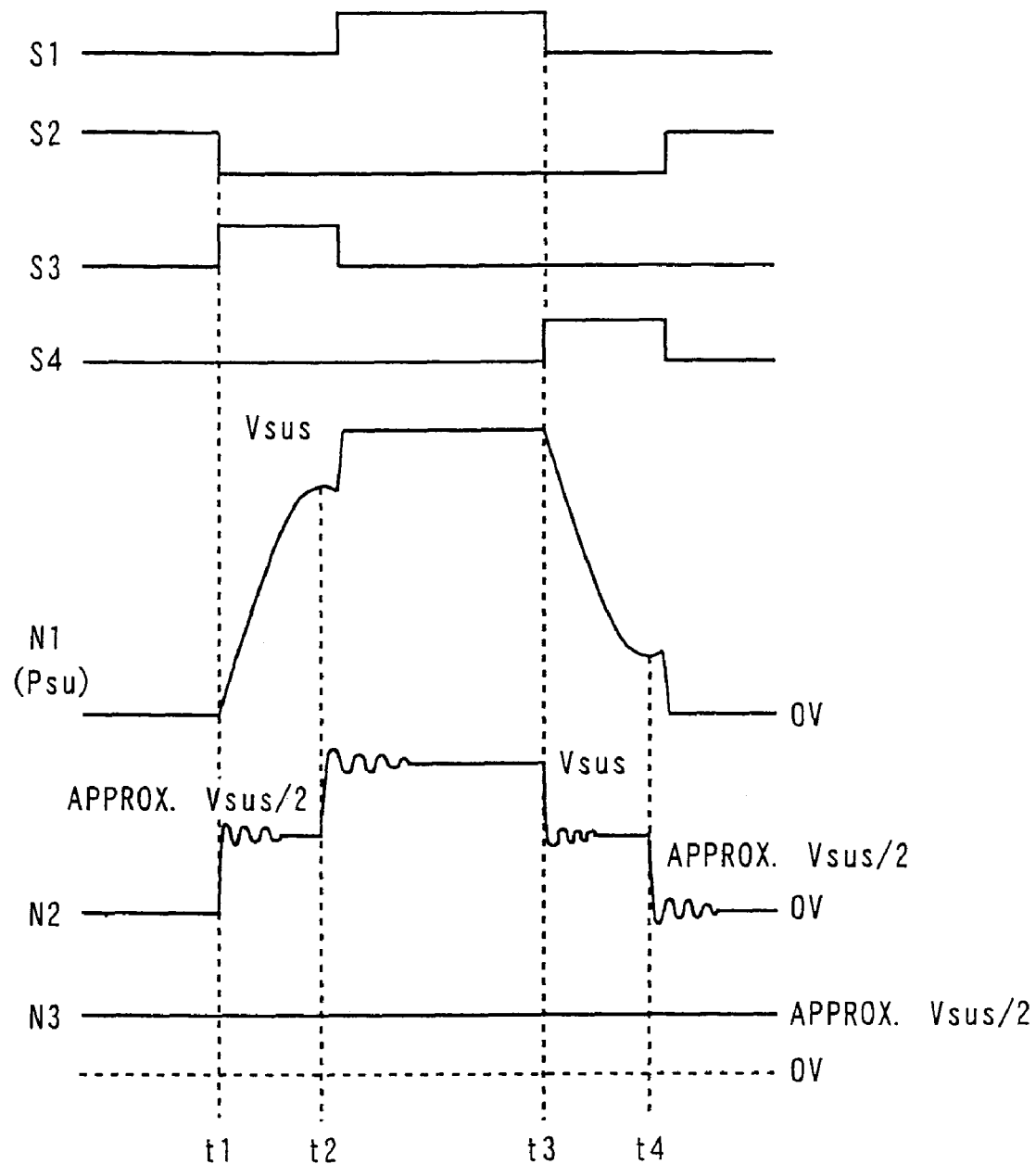
FIG. 7 is a timing chart for use in illustration of the operation of the sustain driver in FIG. 6 during a sustain period.

The operation of the sustain driver 4a having the above configuration during a sustain period will be now described. FIG. 7 is a timing chart for use in illustration of the operation of the sustain driver 4a shown in FIG. 6 during a sustain period. In FIG. 7, the control signals S1 to S4 input to the transistors Q1 to Q4 and the voltages at the nodes N1 to N3 are given. Note that the sustain driver 4a in FIG. 6 operates basically similarly to the sustain driver 4 shown in FIG. 3, and therefore only the different features such as the mechanism of how LC resonance is generated will be described in detail.

LC resonance by the drain-source capacitance CP4 of the transistor Q4 and the inductance component of the line L4 is generated when the transistor Q4 is in an off state and there is an abrupt voltage change at the drain-source region of the transistor Q4. More specifically, the LC resonance by the drain-source capacitance CP4 of the transistor Q4 and the inductance component of the line L4 is generated at time t1 and t2 shown in FIG. 7.

At time t1, the control signal S3 attains a high level, which turns on the transistor Q3, and at the instant the voltage at the node N2 rises from 0V to the level of about Vsus/2, i.e., the potential at the node N3, the LC resonance is generated. At the time, high frequency current is let to pass from the node N2 to the node N3 through the anode-cathode capacitance CP6 of the diode D2, the drain-source capacitance CP4 of the transistor Q4 and the line L4. Therefore, high frequency LC resonance is generated by the drain-source capacitance CP4 of the transistor Q4 and the inductance component of the line L4, and a resultant high frequency electromagnetic wave is radiated.

At time t2, the potential at the node N1 starts to be reduced from the peak voltage by LC resonance by the recovering coil L and the panel capacitance Cp, and when the direction of current flow through the recovering coil L is reversed toward the node N2 from the direction toward the node N1, the diode D1 is turned off, thus cutting off the current path, so that the potential at the node N2 abruptly starts to increase toward the potential level at the node N1. At the time, the floating capacitance connected to the node N2 such as the anode-cathode capacitance CP5 of the diode D1 and the recovering coil L generate LC resonance and at the instant the potential at the node N2 increases while ringing, high frequency LC resonance is generated.

At the time, the diode D2 turns on and high frequency current is let to flow from the node N2 to the node N3 through the drain-source capacitance CP4 of the transistor Q4 and the line L4. Therefore, the drain-source capacitance CP4 of the transistor Q4 and the inductance component of the line L4 generate high frequency LC resonance, and a resultant high frequency electromagnetic wave is radiated.

However, according to the embodiment, the capacitor C4 is connected in parallel to the transistor Q4, and therefore the capacitance contributing to the LC resonance by the drain-source capacitance CP4 of the transistor Q4 and the inductance component of the line L4 is produced by adding the drain-source capacitance CP4 of the transistor Q4 and the capacitor C4. As a result, the resonance frequency is lower than the resonance frequency only by the drain-source capacitance CP4. More specifically, the capacitance of the capacitor C4 is set so that the resonance frequency of the LC resonance is less than 30 MHz and unwanted electromagnetic wave radiation at 30 MHz or higher is suppressed.

LC resonance by the drain-source capacitance CP3 of the transistor Q3 and the inductance component of the line L3 is generated when the transistor Q3 is in an off state and there is an abrupt voltage change at the drain-source region of the transistor Q3. More specifically, the LC resonance by the drain-source capacitance CP3 and the inductance component of the line L3 is generated at time t3 and t4 in FIG. 7.

At time t3, as the power recovering period at the rising of the sustain pulse Psu is over, the control signal S1 attains a high level, which turns on the transistor Q1 and the voltage Vsus at the power supply terminal V1 is applied on the node N2, the control signal S4 attains a high level, which turns on the transistor Q4, so that the LC resonance is generated at the instant the potential at the node N2 falls from Vsus to about Vsus/2, i.e., the potential at the node N3.

At the time, high frequency current is let to flow from the node N3 to the node N2 through the line L3, the drain-source capacitance CP3 of the transistor Q3 and the anode-cathode capacitance CP5 of the diode D1. Therefore, high frequency LC resonance is generated by the drain-source capacitance CP3 of the transistor Q3 and the inductance component of the line L3, and a resultant high frequency electromagnetic wave is radiated.

At time t4, as the power recovering period at the falling of the sustain pulse Psu is over, the direction of the current flow through the recovering coil L is reversed toward the node N1 from the direction toward the node N2, which turns off the diode D2, thus cutting off the current path and the potential at the node N2 abruptly drops to the potential level at the node N1. At the time, the floating capacitance connected to the node N2 such as the anode-cathode capacitance CP6 of the diode D2 and the recovering coil L generate LC resonance, and high frequency LC resonance results at the instant the potential at the node N2 drops while ringing.

At the time, the diode D1 turns on, and high frequency current is let to flow from the node N3 to the node N2 through the line L3 and the drain-source capacitance CP3 of the transistor Q3. Therefore, high frequency LC resonance is generated by the drain-source capacitance CP3 of the transistor Q3 and the inductance component of the line L3, and a resultant high frequency electromagnetic wave is radiated.

However, according to the embodiment, the capacitor C3 is connected in parallel to the transistor Q3, so that the capacitance contributing to the LC resonance by the drain-source capacitance CP3 of the transistor Q3 and the inductance component of the line L3 is produced by adding the drain-source capacitance CP3 of the transistor Q3 and the capacitor C3, and therefore, the resonance frequency is lower than the resonance frequency only by the drain-source capacitance CP3. More specifically, the capacitance of the capacitor C3 is set so that the resonance frequency of the LC resonance is less than 30 MHz, and unwanted electromagnetic wave radiation at 30 MHz or higher is suppressed.

As described above, also according to the embodiment, since the capacitors C3 and C4 are connected in parallel to the drain-source regions of the transistors Q3 and Q4, the resonance frequency of the LC resonance generated by the inductance components of the lines L3 and L4 and the drain-source capacitances CP3 and CP4 of the transistors Q3 and Q4 can be shifted to a low frequency level less than 30 MHz. As a result, high frequency electromagnetic wave radiation at 30 MHz or higher can be suppressed.

Figure 8:
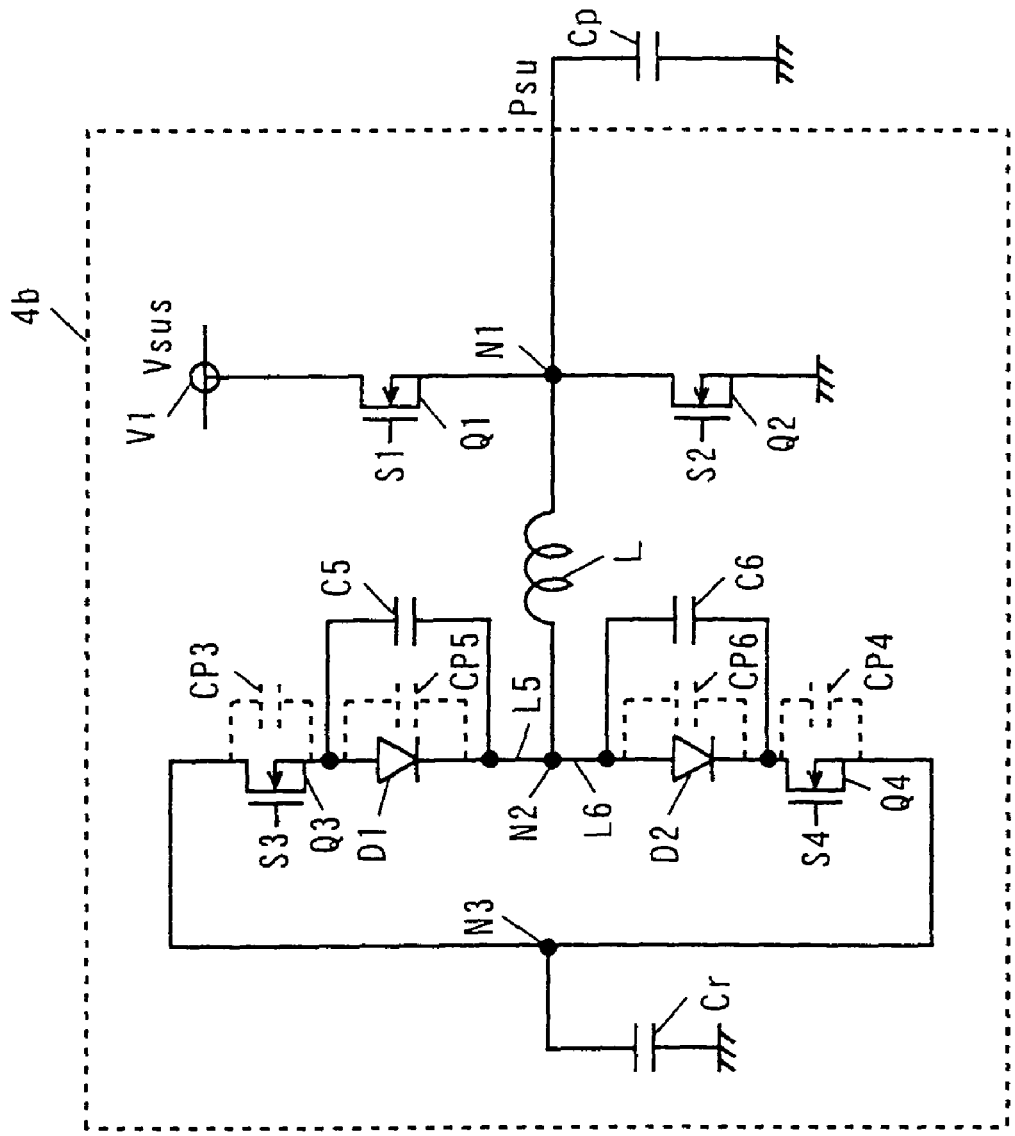
FIG. 8 is a circuit diagram showing the configuration of a sustain driver according to a third embodiment of the present invention.

FIG. 8 is a circuit diagram showing the configuration of a sustain driver according to a third embodiment of the present invention.

The sustain driver 4b in FIG. 8 is different from the sustain driver 4 in FIG. 3 in that the capacitors C1 and C2 are not provided and that there are additional capacitors C5 and C6 connected in parallel to the diodes D1 and D2. The other part is the same as that of the sustain driver 4 in FIG. 3 and therefore the same portions are denoted by the same reference characters and are not detailed.

As shown in FIG. 8, the capacitor C5 is connected in parallel to the anode-cathode region of the diode D1, and the capacitor C6 is connected in parallel to the anode-cathode region of the diode D2. The cathode of the diode D1 is connected to the node N2 through the line L5, and the anode of the diode D2 is connected to the node N2 through the line L6. The diode D1 has an anode-cathode capacitance CP5 as a parasitic capacitance, and the diode D2 has an anode-cathode capacitance CP6 as a parasitic capacitance. Note that the transistors Q3 and Q4 have parasitic capacitances CP3 and CP4 similarly to the second embodiment.

According to the embodiment, the diodes D1 and D2 correspond to the electrical circuit, the switching circuit and the sustain pulse switching circuit, the lines L5 and L6 to the interconnection portion, the capacitors C5 and C6 to the frequency reducing circuit, the recovering coil L to the inductance element, the recovering capacitor Cr to the recovering capacitive element, the diodes D1 and D2 to the one-way conductive element and the transistors Q3 and Q4 to the switching element.

The operation of the sustain driver 4b having the above-described configuration during a sustain period will be now described. Note that the sustain driver 4b shown in FIG. 8 operates basically similarly to the sustain drivers 4 and 4a in FIGS. 3 and 6, respectively and therefore only different features such as the mechanism of how LC resonance is generated will be described in detail.

LC resonance by the anode-cathode capacitance CP5 of the diode D1 and the inductance component of the line L5 is generated when the diode D1 is in an off state, and there is an abrupt voltage change at the anode-cathode region of the diode D1. More specifically, at time t2 and t3 in FIG. 7, the LC resonance by the anode-cathode capacitance CP5 and the inductance component of the line L5 is generated.

At time t2, as the control signal S3 is at a high level, which turns on the transistor Q3, and the potential at the node N2 is at about the same level as Vsus/2, i.e., about the potential level at the node N3, the potential at the node N1 starts to be reduced from the peak voltage by LC resonance by the recovering coil L and the panel capacitance Cp. When the direction of the current flow through the recovering coil L is reversed toward the node N2 from the direction toward the node N1, the diode D1 is turned off, thus cutting off the current path, and the potential at the node N2 is abruptly raised toward the level of the potential at the node N1. At the time, the floating capacitance connected to the node N2 such as the anode-cathode capacitance CP5 of the diode D1 and the recovering coil L generate LC resonance, and at the instant the potential at the node N2 rises while ringing, high frequency LC resonance is generated.

At the time, the diode D1 is in a reverse bias, off state, while the transistor Q3 is in an on state. Therefore, high frequency current is let to flow from the node N2 to the node N3 through the line L5 and the anode-cathode capacitance CP5 of the diode D1. Therefore, high frequency LC resonance by the anode-cathode capacitance CP5 of the diode D1 and the inductance component of the line L5 is generated and a resultant high frequency electromagnetic wave is radiated.

At time t3, as the power recovering period at the rising of the sustain pulse Psu is over, the control signal S1 attains a high level, which turns on the transistor Q1 and the voltage Vsus at the power supply terminal V1 is applied to the node N2, the control signal S4 attains a high level, which turns on the transistor Q4 and LC resonance is generated at the instant the potential at the node N2 falls from Vsus to about Vsus/2, i.e., the potential level at the node N3.

At the time, high frequency current is let to flow from the node N3 to the node N2 through the drain-source capacitance CP3 of the transistor Q3, the anode-cathode capacitance CP5 of the diode D1 and the line L5. Therefore, the anode-cathode capacitance CP5 of the diode D1 and the inductance component of the line L5 generate high frequency LC resonance and a resultant high frequency electromagnetic wave is radiated.

However, according to the embodiment, since the capacitor C5 is connected in parallel to the diode D1, the capacitance contributing to the LC resonance by the anode-cathode capacitance CP5 of the diode D1 and the inductance component of the line L5 is produced by adding the anode-cathode capacitance CP5 of the diode D1 and the capacitor C5, and therefore the resonance frequency is lower than the resonance frequency only by the anode-cathode capacitance CP5. More specifically, the capacitance of the capacitor C5 is set so that the resonance frequency of the LC resonance is less than 30 MHz, and unwanted electromagnetic wave radiation at 30 MHz or higher is suppressed.

The LC resonance by the anode-cathode capacitance CP6 of the diode D2 and the inductance component of the line L6 is generated when the diode D2 is in an off state and there is an abrupt voltage change at the anode-cathode region of the diode D2. More specifically, the LC resonance is generated by the anode-cathode capacitance CP6 and the inductance component of the line L6 at time t1 and t4 in FIG. 7.

At time t1, the control signal S3 attains a high level, which turns on the transistor Q3, and at the instant the potential at the node N2 rises from 0V to about Vsus/2, i.e., the voltage level at the node N3, the LC resonance is generated. At the time, high frequency current is let to flow from the node N2 to the node N3 through the line L6, the anode-cathode capacitance CP6 of the diode D2 and the drain-source capacitance CP4 of the transistor Q4. Therefore, the anode-cathode capacitance CP6 of the diode D2 and the inductance component of the line L6 generate high frequency LC resonance, and a resultant high frequency electromagnetic wave is radiated.

At time t4, as the power recovering period at the falling of the sustain pulse Psu is over, and the direction of the current flow through the recovering coil L is reversed toward the node N1 from the direction toward node N2, the diode D2 is turned off, thus cutting off the current path and the potential at the node N2 abruptly drops to the potential level at the node N1. At the time, the floating capacitance connected to the node N2 such as the anode-cathode capacitance CP6 of the diode D2 and the recovering coil L generate LC resonance, and high frequency LC resonance is generated at the instant the potential at the node N2 drops while ringing.

At the time, the diode D2 is in a reverse bias, off state, while the transistor Q4 is in an on state, and therefore high frequency current is let to flow from the node N3 to the node N2 through the anode-cathode capacitance CP6 of the diode D2 and the line L6. Therefore, high frequency LC resonance is generated by the anode-cathode capacitance CP6 of the diode D2 and the inductance component of the line L6 and a resultant high frequency electromagnetic wave is radiated.

According to the embodiment, however, the capacitor C6 is connected in parallel to the diode D2 and therefore the capacitance contributing to the LC resonance by the anode-cathode capacitance CP6 of the diode D2 and the inductance component of the line L6 is produced by adding the anode-cathode capacitance CP6 of the diode D2 and the capacitor C6. Therefore, the resonance frequency is lower than that only by the anode-cathode capacitance CP6. More specifically, the capacitance of the capacitor C6 is set so that the resonance frequency of the LC resonance is less than 30 MHz, and unwanted electromagnetic wave radiation at 30 MHz or higher is suppressed.

As described above, also according to the embodiment, the capacitors C5 and C6 are connected in parallel to the anode-cathode regions of the diodes D1 and D2, respectively and therefore the resonance frequency of LC resonance generated by the inductance components of the lines L5 and L6 and the anode-cathode capacitances CP5 and CP6 of the diodes D1 and D2 can be shifted to a low frequency level less than 30 MHz. As a result, high frequency electromagnetic wave radiation at 30 MHz or higher can be suppressed.

Figure 9:
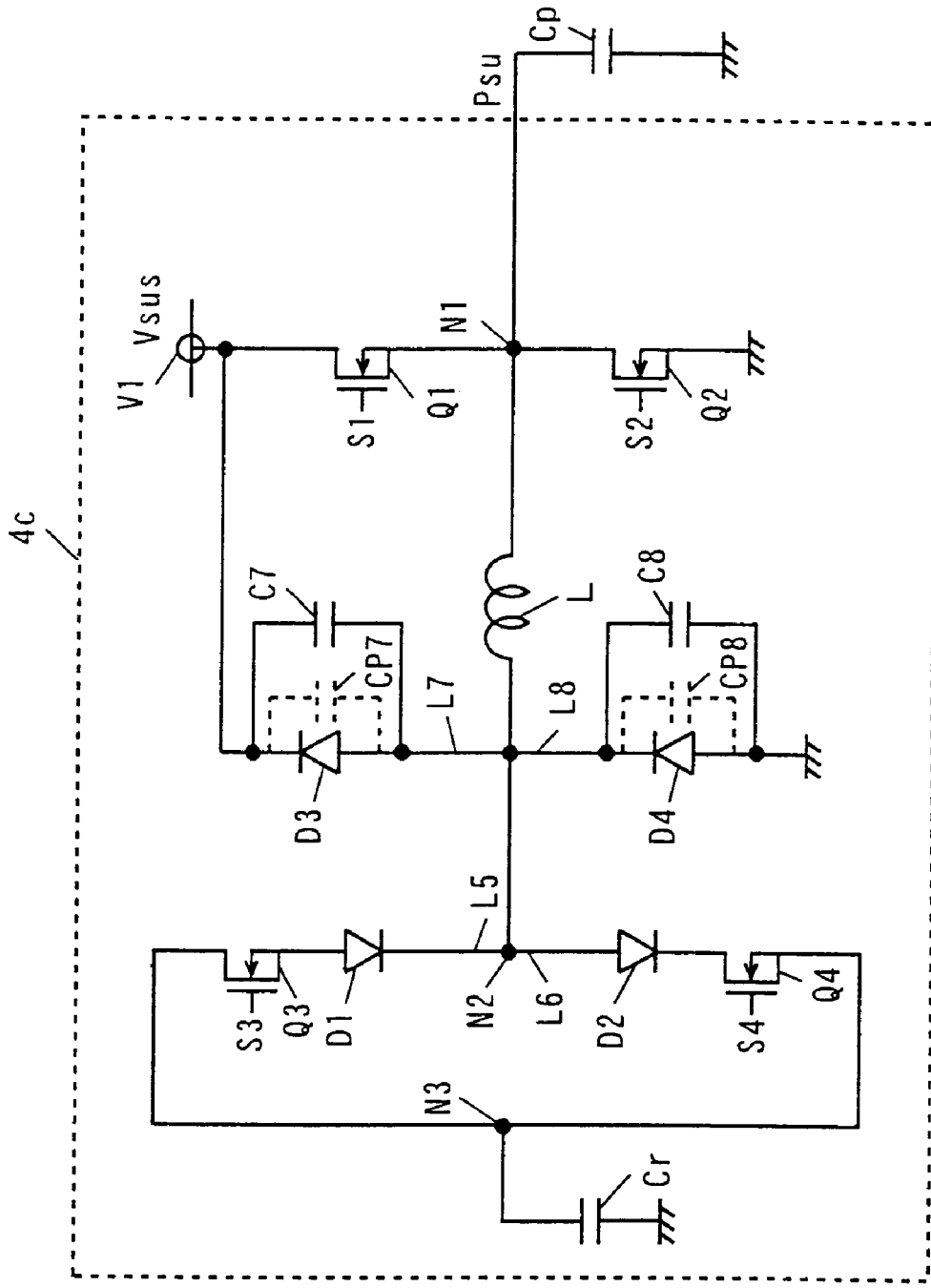
FIG. 9 is a circuit diagram showing the configuration of a sustain driver according to a fourth embodiment of the present invention.

FIG. 9 is a circuit diagram showing the configuration of a sustain driver according to a fourth embodiment of the present invention.

The sustain driver 4c in FIG. 9 is different from the sustain driver 4 in FIG. 3 in that the capacitors C1 and C2 are not provided, that a diode D3 and a capacitor C7 are additionally provided between the power supply terminal V1 and the node N2, and that a diode D4 and a capacitor C8 are additionally provided between the node N2 and the ground terminal. The other part is the same as that of the sustain driver 4 shown in FIG. 3 and therefore the same portions are denoted by the same reference characters and not detailed.

As shown in FIG. 9, the diode D3 has its cathode connected to the power supply terminal V1 and its anode connected to the node N2 through the line L7. The diode D3 has an anode-cathode capacitance CP7 as a parasitic capacitance, and the capacitor C7 is connected in parallel to the anode-cathode region of the diode D3.

The diode D4 has its cathode connected to the node N2 through the line L8 and its anode connected to the ground terminal. The diode D4 has an anode-cathode capacitance CP8 as a parasitic capacitance, and the capacitor C8 is connected in parallel to the anode-cathode region of the diode D4.

The diodes D3 and D4 are additionally provided to serve as a current clip, and protect the transistors Q3 and Q4 against voltage higher than the breakdown voltage of these transistors if they have low breakdown voltage. Therefore, the diode D3 is usually in an off state, and turns on only when the potential at the node N2 exceeds Vsus, while the diode D4 is usually in an off state and turns on only when the potential at the node N2 is lower than 0V. therefore, the potential at the node N2 is clipped at a level in the range from 0V to Vsus.

According to the embodiment, the diodes D3 and D4 correspond to the electrical circuit and the protection circuit, the lines L7 and L8 to the interconnection portion, the capacitors C7 and C8 to the frequency reducing circuit, the power supply terminal V1 and the ground terminal to the voltage source, the recovering coil L to the inductance element, the recovering capacitor Cr to the recovering capacitive element, the transistors Q3 and Q4 and the diodes D1 and D2 to the connection circuit, the diodes D3 and D4 to the one-way conductive element, and the capacitors C7 and C8 to the capacitive element.

Figure 10:
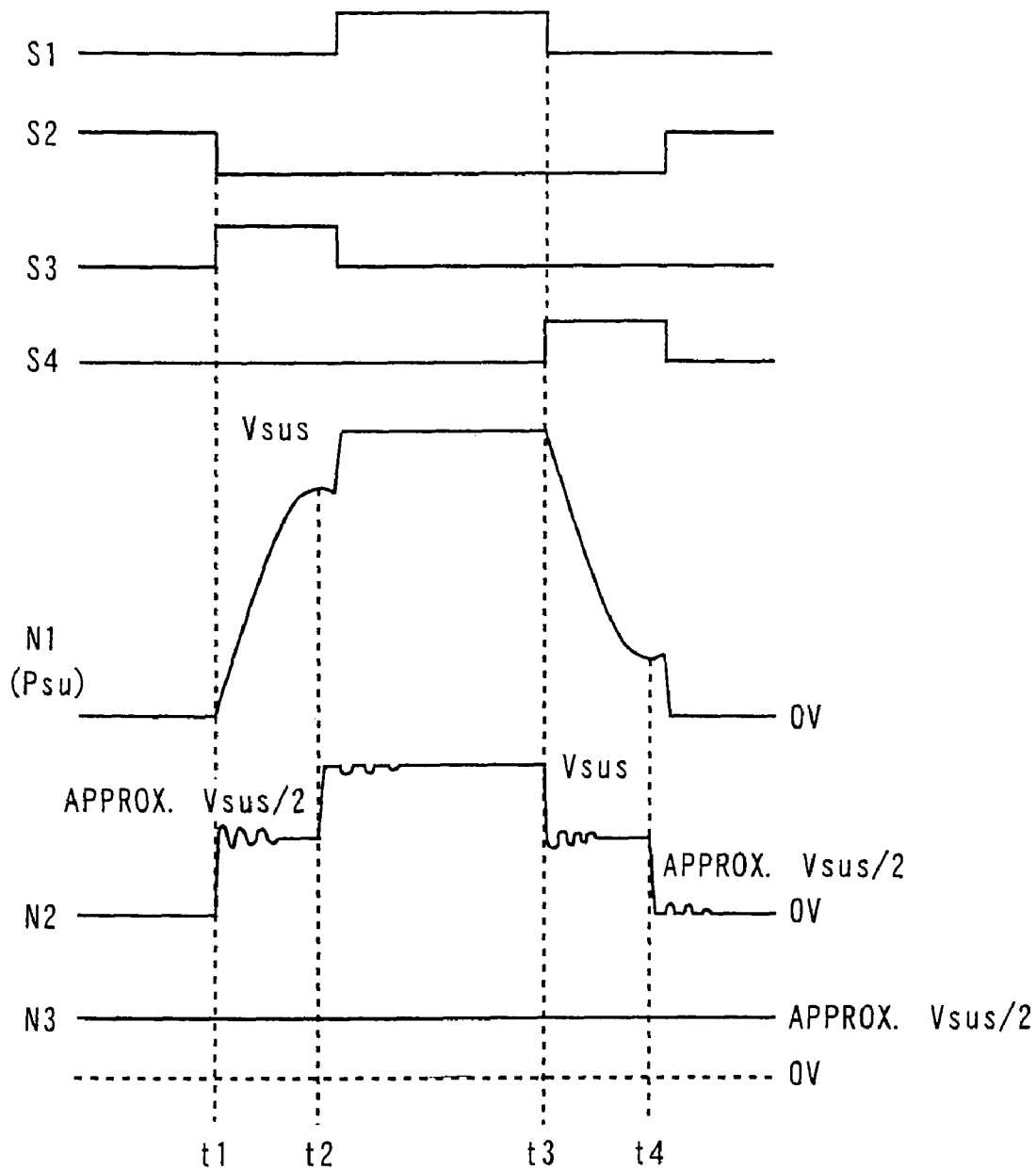
FIG. 10 is a timing chart for use in illustration of the operation of the sustain driver in FIG. 9 during a sustain period.

The operation of the sustain driver 4c having the above-described configuration during a sustain period will be now described. FIG. 10 is a timing chart for use in illustration of the operation of the sustain driver 4c shown in FIG. 9 during a sustain period. FIG. 10 shows control signals S1 to S4 input to the transistors Q1 to Q4, and voltages at the nodes N1 to N3. Note that the sustain driver 4c in FIG. 9 operates basically similarly to the sustain drivers 4 and 4c shown in FIGS. 3 and 6, respectively and therefore, only different features such as the mechanism of how LC resonance is generated will be described in detail.

LC resonance by the anode-cathode capacitance CP7 of the diode D3 and the inductance component of the line L7 is generated when the diode D3 is in an off state and there is an abrupt voltage change at the anode-cathode region of the diode D3. Here, since the potential on the cathode side of the diode D3 is fixed at the level of Vsus by the power supply terminal V1, the anode-cathode voltage of the diode D3 changes in all the timings in that the potential at the node N2 changes.

More specifically, as shown in FIG. 10, the anode-cathode voltage of the diode D3 changes at the instant the transistor Q3 turns on, and the potential at the node N2 rises from 0V to about the level of Vsus/2, i.e., at time t1, at the instant the power recovering period at the rising is over and the potential at the node N2 rises toward the level of Vsus, i.e., at time t2, at the instant the transistor Q4 turns on and the potential at the node N2 is reduced from the level of Vsus to about Vsus/2, i.e., at time t3 and at the instant the power recovering period at the falling is over and the potential at the node N2 is reduced toward 0V, i.e., at time t4. At the time, high frequency current is passed across the anode-cathode capacitance CP7, the anode-cathode capacitance CP7 of the diode D3 and the inductance component of the line L7 generate high frequency LC resonance, and a resultant high frequency electromagnetic wave is radiated.

However, according to the embodiment, since the capacitor C7 is connected in parallel to the diode D3, the capacitance contributing to the LC resonance by the anode-cathode capacitance CP7 of the diode D3 and the inductance component of the line L7 is produced by adding the anode-cathode capacitance CP7 of the diode D3 and the capacitor C7, and therefore the resonance frequency is lower than the resonance frequency only by the anode-cathode capacitance CP7. More specifically, the capacitance of the capacitor C7 is set so that the resonance frequency of the LC resonance is less than 30 MHz and unwanted electromagnetic wave radiation at 30 MHz or higher is suppressed.

LC resonance by the anode-cathode capacitance CP8 of the diode D4 and the inductance component of the line L8 is generated when the diode D4 is in an off state and there is an abrupt voltage change at the anode-cathode region of the diode D4. Here, the potential on the anode side of the diode D4 is fixed at the level of 0V by the ground terminal, and therefore the voltage across the anode-cathode region of the diode D3 changes in all the timings in that the potential at the node N2 changes.

As a result, similarly to the diode D3, the anode-cathode voltage of the diode D4 changes in each of the timings t1 to t4 described above. At the time, high frequency current is passed across the anode-cathode capacitance CP8, high frequency LC resonance is generated by the anode-cathode capacitance CP8 of the diode D4 and the inductance component of the line L8 and a resultant high frequency electromagnetic wave is radiated.

However, according to the embodiment, since the capacitor C8 is connected in parallel to the diode D4, the capacitance contributing to the LC resonance by the anode-cathode capacitance CP8 of the diode D4 and the inductance component of the line L8 is produced by adding the anode-cathode capacitance CP8 of the diode D4 and the capacitor C8. Therefore, the resonance frequency is lower than the resonance frequency only by the anode-cathode capacitance CP8. More specifically, the capacitance of the capacitor C8 is set so that the resonance frequency of the LC resonance is less than 30 MHz and unwanted electromagnetic wave radiation at 30 MHz or higher is suppressed.

As described above, also according to the embodiment, since the capacitors C7 and C8 are connected in parallel to the anode-cathode regions of the diodes D3 and D4, the resonance frequency of the LC resonance generated by the inductance components of the lines L7 and L8 and the capacitances CP7 and CP8 of the diodes D3 and D4 may be shifted to a low frequency level less than 30 MHz. As a result, high frequency electromagnetic wave radiation at 30 MHz or higher can be suppressed.

Figure 11:
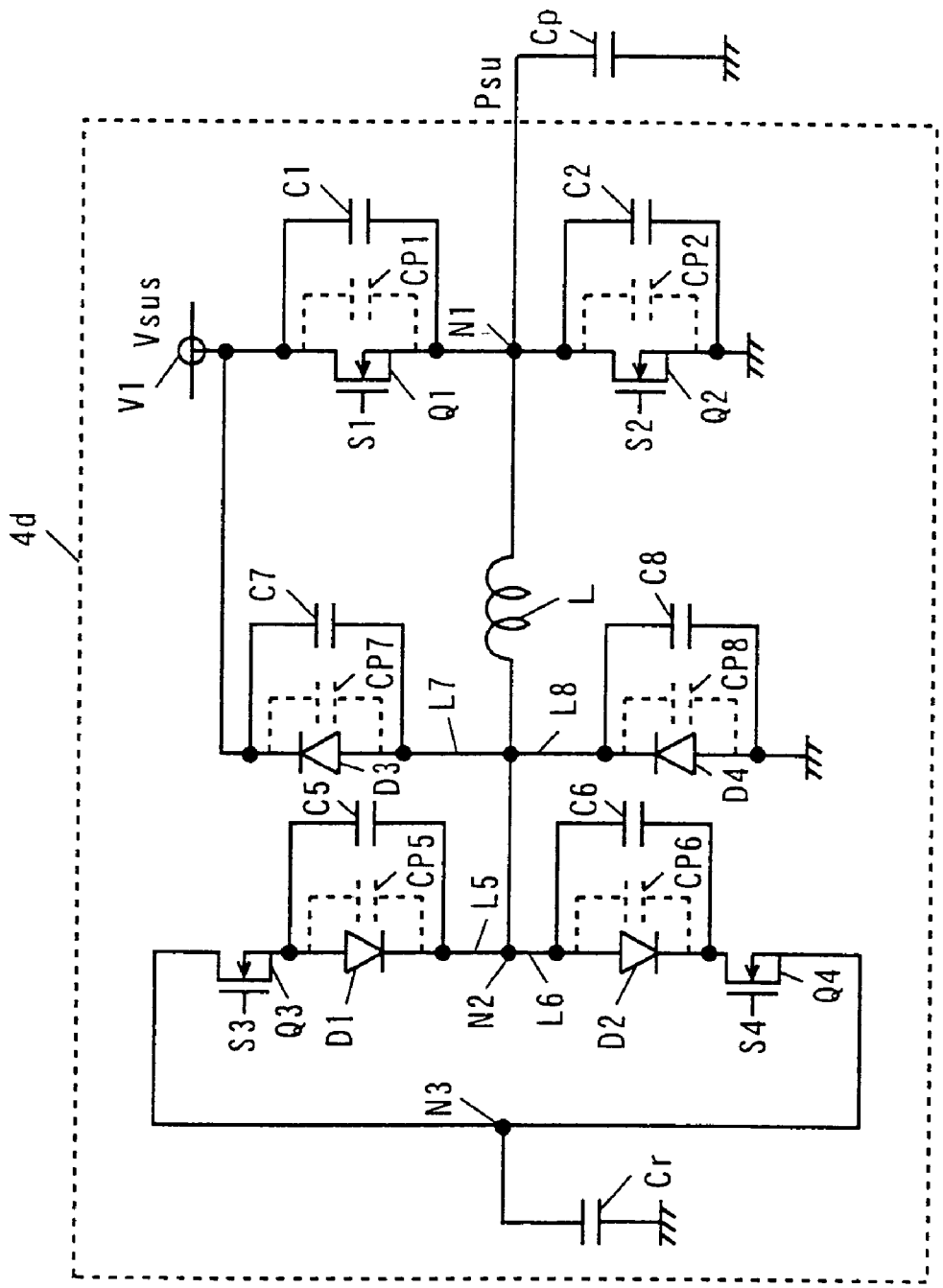
FIG. 11 is a circuit diagram showing the configuration of a sustain driver according to a fifth embodiment of the present invention.

FIG. 11 is a circuit diagram showing the configuration of a sustain driver according to a fifth embodiment of the invention.

The sustain driver 4d in FIG. 11 is different from the sustain driver 4 in FIG. 3 in that diodes D3 and D4 and capacitors C5 to C8 are additionally provided similarly to the sustain drivers 4b and 4c shown in FIGS. 8 and 9, respectively, and the other part is the same as that of the sustain driver 4 shown in FIG. 3. Therefore, the same portions are denoted by the same reference characters and are not detailed.

According to the embodiment, similarly to the first, third and fourth embodiments, the capacitors C1 and C2, C5 to C8 are connected in parallel to the transistors Q1 and Q2 and diodes D1 to D4, respectively and therefore, the effects of the first, third and fourth embodiments can be provided, and the resonance frequency of each LC resonance can be shifted to a low frequency level less than 30 MHz, so that high frequency electromagnetic wave radiation at 30 MHz or higher can be suppressed. Note that the above embodiments may be combined in various manners rather than being limited to the above, and the various combinations may provide the same effects by the embodiments.

Note that in the above description, the sustain drivers are described as the driving circuit by way of illustration, while the present invention may similarly be applied to scan drivers, and the same effects result.

The present invention may be applied to a scan driver 3 shown in FIG. 1 for example in the following manner.

Figure 12:
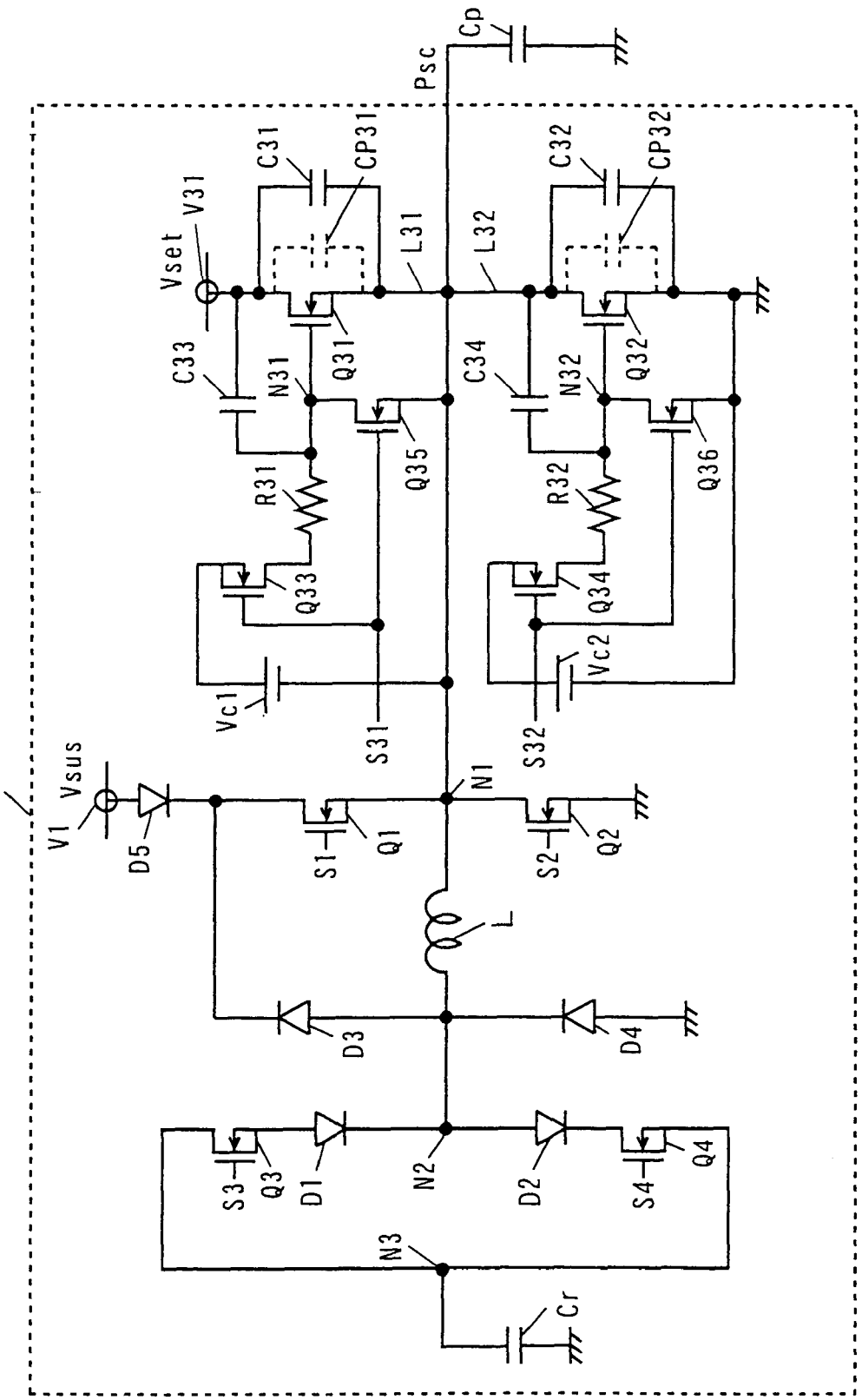
FIG. 12 is a circuit diagram showing the configuration of a scan driver according to a sixth embodiment of the present invention.

FIG. 12 is a circuit diagram showing the configuration of a scan driver according to a sixth embodiment of the present invention.

The scan driver 3 in FIG. 12 is different from the sustain driver 4 in FIG. 3 in that an initialization circuit including transistors Q31 to Q36, capacitors C31 to C34, resistors R31 and R32, power supplies Vc1 and Vc2, and a power supply terminal V31 is additionally provided and protection diodes D3 to D5 are additionally provided as well. The other part is the same as that of the sustain driver 4 shown in FIG. 3, and therefore the same portions are denoted by the same reference characters and are not detailed.

As shown in FIG. 12, the transistor Q31 has one end connected to the power supply terminal V31, the other end connected to the node N1 through a line L31, and its gate connected to the node N31. The transistor Q31 has a drain-source capacitance CP31 as a parasitic capacitance, and the capacitor C31 is connected in parallel to the drain-source region of the transistor Q31. The capacitor C33 is connected between the power supply terminal V31 and the node N31. The power supply terminal V31 is provided with a setup voltage Vset.

The transistor Q33 has one end connected to the node N1 through the power supply Vc1 and the other end connected to one end of the resistor R31, and receives a control signal S31 as an input at its gate. The resistor R31 has the other end connected to the node N31. The transistor Q35 has one end connected to the node N31 and the other end connected to the node N1 and receives the control signal S31 as an input at its gate.

The transistor Q32 has one end connected to the ground terminal, the other end connected to the node N1 through a line L32, and its gate connected to the node N32. The transistor Q32 has a drain-source capacitance CP32 as a parasitic capacitance, and the capacitor C32 is connected in parallel to the drain-source region of the transistor Q32. The capacitor C34 is connected between the nodes N1 and N32.

The transistor Q34 has one end connected to the ground terminal through the power supply Vc2, the other end connected to one end of the resistor R32, and receives a control signal S32 as an input at its gate. The other end of the resistor R32 is connected to the node N32. The transistor Q36 has one end connected to the node N32 and the other end connected to the ground terminal, and receives the control signal S32 as an input at its gate. The protection diodes D3 to D5 are connected between the connection node of the diode D5 and the transistor Q1 and the node N2, between the node N2 and the ground terminal, and between the power supply terminal V1 and the transistor Q1.

According to the embodiment, the transistors Q31 and Q32 correspond to the electrical circuit, the switching circuit and the initialization pulse switching circuit, the lines L31 and L32 to the interconnection portion, the capacitors C31 and C32 to the frequency reducing circuit, and the power supply terminal V31 and the ground terminal to the voltage source. The transistor Q31 corresponds to the first switching element, the transistor Q32 to the second switching element, the line L31 to the first interconnection portion, the line L32 to the second interconnection portion, the capacitor C31 to the first capacitive element, the capacitor C32 to the second capacitive element, the power supply terminal V31 to the first voltage source, and the ground terminal to the second voltage source.

The operation of the initialization circuit having the above-described configuration will be now described. The operation of the scan driver 3 during a sustain period is similar to that shown in FIG. 10.

When the potential of the initialization pulse Pset is at the level of 0V, the transistors Q31 and Q32 are both in an off state. More specifically, the control signals S31 and S32 both attain a high level, the transistors Q35 and Q36 turn on, the gate-source voltages of the transistors Q31 and Q32 are both at 0V and the transistors Q31 and Q32 are both in an off state.

Then, when the control signal S31 attains a low level, the transistor Q35 turns off, and the gate of the transistor Q31 is disconnected from the node N1. At the time, the transistor Q33 turns on, current from the power supply terminal V31 comes into the gate of the transistor Q31 with a time constant determined by the capacitor C33 and the resistor R31, which causes the potential at the gate of the transistor Q31 to start to rise.

In this state, when the voltage at the node N31 reaches a level which allows the transistor Q31 to turn on, the transistor Q31 turns on, and the source potential of the transistor Q31, i.e., the potential at the node N1 starts to gradually rise. As the potential at the node N1 rises, the potential at the power supply Vc1 is raised accordingly, so that the transistor Q33 continues to be in an on state. As a result, the potential at the node N1 is equal to the setup voltage Vset of the power supply terminal V31 and saturated.

Then, when the control signal S31 is again pulled to a high level, the transistor Q35 turns on, the gate potential of the transistor Q31 immediately becomes equal to the source potential, which turns off the transistor Q31. Immediately after the operation, when the control signal S32 is pulled to a low level, then the transistor Q36 turns off and the transistor Q34 turns on, so that the potential at the gate of the transistor Q32 starts to rise with a time constant determined by the resistor R32 and capacitor C32.

In this state, when the potential at the gate of the transistor Q32 rises to a prescribed potential, the transistor Q32 starts to turn on, therefore charges accumulated at the node N1 are gradually discharged through the transistor Q32, and the voltage at the node N1 eventually falls to the level of 0V.

By the above operation, as shown in FIG. 2, a triangular initialization pulse Pset which rises from 0V to the voltage Vset in a ramp waveform, and then falls from Vset to 0V in a ramp waveform is output during an initialization period.

Thus, the transistors Q31 and Q32 are used to generate the initialization pulse Pset during the initialization period, the panel capacitance Cp is connected to the node N1 in a current supply path for current flow for charging/discharging the capacitance Cp, and is usually in an off state other than during the initialization period. As a result, the drain-source capacitances CP31 and CP32 of the transistors Q31 and Q32 are connected to the node N1 as loads.

Here, since the potential at each one end of the transistors Q31 and Q32 is fixed, in other words the potential is fixed at the level of voltage Vset or the ground potential, a change in the potential at the node N1 causes high frequency current to be passed across the drain-source capacitances CP31 and CP32. In particular, high frequency current is passed at the instant the sustain pulse Psc is clamped to Vsus from the power recovering period at the rising, i.e., immediately after time t2, and at the instant the sustain pulse Psc is clamped to the ground potential from the power recovering period at the falling, i.e., immediately after time t4. Therefore, high frequency LC resonance is generated by the drain-source capacitances CP31 and CP32 of the transistors Q31 and Q32 and the lines L31 and L32, and a resultant high frequency electromagnetic wave is radiated. However, according to the embodiment, since capacitors C31 and C32 are connected in parallel to the transistors Q31 and Q32, respectively, the capacitance contributing to the LC resonance by the drain-source capacitances CP31 and CP32 of the transistors Q31 and Q32 and the inductance components of lines L31 and L32 is produced by adding the drain-source capacitances CP31 and CP32 of the transistors Q31 and Q32 and the capacitors C31 and C32, and therefore the resonance frequency is lower than the resonance frequency only by the drain-source capacitances CP31 and CP32. More specifically, the capacitances of the capacitors C31 and C32 are set so that the resonance frequency of the LC resonance is less than 30 MHz, and unwanted electromagnetic wave radiation at 30 MHz or higher is suppressed.

As described above, also according to the embodiment, since capacitors C31 and C32 are connected in parallel to the drain-source regions of the transistors Q31 and Q32, respectively, the resonance frequency of the LC resonance by the inductance components of the lines L31 and L32 and the drain-source capacitances CP31 and CP32 of the transistors Q31 and Q32 can be shifted to a low frequency level less than 30 MHz. Therefore, high frequency electromagnetic wave radiation at 30 MHz or higher can be suppressed.

We claim:

1. A driving circuit that drives a display panel having an electrode, comprising:
    a switcher connected to a power supply;
    an interconnector connected to said switcher; and
    a frequency reducer connected in parallel with said switcher that is operable to reduce a resonance frequency of an LC resonance resulting from a parasitic capacitance of said switcher and an inductance component of said interconnector, wherein a potential of said power supply is applied to the electrode of the display panel through said switcher and said interconnector.

2. A driving circuit that drives a display panel having an electrode, comprising:
    a switcher connected to a power supply;
    an interconnector connected to said switcher; and
    a frequency reducer connected in parallel with said switcher that is operable to reduce a resonance frequency of an LC resonance resulting from a parasitic capacitance of said switcher and an inductance component of said interconnector to a level less than 30 MHz, wherein a potential of said power supply is applied to the electrode of the display panel through said switcher and said interconnector.

3. A driving circuit that drives a display panel having an electrode, comprising:
    a switcher connected to a power supply;
    an interconnector connected to said switcher; and
    a frequency reducing device having a capacitive element connected in parallel with said switcher that is operable to reduce a resonance frequency of an LC resonance resulting from a parasitic capacitance of said switcher and an inductance component of said interconnector, wherein a potential of said power supply is applied to the electrode of the display panel through said switcher and said interconnector.

4. A driving circuit that drives a display panel having an electrode, comprising:
    a switcher connected to a power supply;
    a first interconnector connected to said switcher;
    a protector connected to said power supply;
    a second interconnector connected to said protector and said first interconnector; and
    a frequency reducing device connected in parallel with said protector that is operable to reduce a resonance frequency of an LC resonance resulting from a parasitic capacitance of said protector and an inductance component of said second interconnector, wherein a potential of the electrode of the display panel is brought to a level that does not exceed a potential of said power supply through said protector and said second interconnector.

5. A driving circuit that drives a display panel having an electrode, comprising:
    a switcher connected to a power supply;
    a first interconnector connected to said switcher;
    a protector including a one-way conducting element;
    a second interconnector connected to said protector and said first interconnector; and
    a frequency reducer connected in parallel with said protector that is operable to reduce a resonance frequency of an LC resonance resulting from a parasitic capacitance of said protector and an inductance component of said second interconnector, wherein a potential of the electrode of the display panel is brought to a level that does not exceed a potential of said power supply through said protector and said second interconnector.

6. A driving circuit that drives a display panel having an electrode, comprising:
    a switcher connected to a power supply;
    a first interconnector connected to said switcher;
    a protector connected to said power supply;
    a second interconnector connected to said protector and said first interconnector; and
    a frequency reducer connected in parallel with said protector that is operable to reduce a resonance frequency of an LC resonance resulting from a parasitic capacitance of said protector and an inductance component of said second interconnector to a level less than 30 MHz, wherein a potential of the electrode of the display panel is brought to a level that does not exceed a potential of said power supply through said protector and said second interconnector.

7. A driving circuit that drives a display panel having an electrode, comprising:
- a switcher connected to a power supply;
- a first interconnector connected to said switcher;
- a protector connected to said power supply;
- a second interconnector connected to said protector and said first interconnector; and
- a frequency reducer having a capacitive element connected in parallel with said protector, wherein the electrode of the display panel is brought to a potential level that does not exceed a potential of said power supply through said protector and said second interconnector.

8. A driving circuit that drives a display panel having an electrode, comprising:
- a switcher connected to a ground;
- an interconnector connected to said switcher; and
- a frequency reducer connected in parallel with said switcher that is operable to reduce a resonance frequency of an LC resonance resulting from a parasitic capacitance of said switcher and an inductance component of said interconnector, wherein the electrode of the display panel is brought to a ground potential through said switcher and said interconnector.

9. A driving circuit that drives a display panel having an electrode, comprising:
- a switcher connected to a ground;
- an interconnector connected to said switcher; and
- a frequency reducer connected in parallel with said switcher that is operable to reduce a resonance frequency of an LC resonance resulting from a parasitic capacitance of said switcher and an inductance component of said interconnector to a level less than 30 MHz, wherein the electrode of the display panel is brought to a ground potential through said switcher and said interconnector.

10. A driving circuit that drives a display panel having an electrode, comprising:
- a switcher connected to a ground;
- an interconnector connected to said switcher; and
- a frequency reducer having a capacitive element connected in parallel with said switcher that is operable to reduce a resonance frequency of an LC resonance resulting from a parasitic capacitance of said switcher and an inductance component of said interconnector, wherein the electrode of the display panel is brought to a ground potential through said switcher and said interconnector.

11. A driving circuit that drives a display panel having an electrode, comprising:
- a switcher connected to a ground;
- a first interconnector connected to said switcher;
- a protector connected to said ground;
- a second interconnector connected to said protector and said first interconnector; and
- a frequency reducer connected in parallel with said protector that is operable to reduce a resonance frequency of an LC resonance resulting from a parasitic capacitance of said protector and an inductance component of said second interconnector, wherein the electrode of the display panel is brought to a ground potential through said protector and said second interconnector.

12. A driving circuit that drives a display panel having an electrode, comprising:
- a switcher connected to a ground;
- a first interconnector connected to said switcher;
- a protector connected to said ground, said conductor being conductive in a single direction;
- a second interconnector connected to said protector and said first interconnector; and
- a frequency reducer connected in parallel with said protector that is operable to reduce a resonance frequency of an LC resonance resulting from a parasitic capacitance of said protector and an inductance component of said second interconnector, wherein the electrode of the display panel is brought to a ground potential through said protector and said second interconnector.

13. A driving circuit that drives a display panel having an electrode, comprising:
- a switcher connected to a ground;
- a first interconnector connected to said switcher;
- a protector connected to said ground;
- a second interconnector connected to said protector and said first interconnector; and
- a frequency reducer connected in parallel with said protector that is operable to reduce a resonance frequency of an LC resonance resulting from a parasitic capacitance of said protector and an inductance component of said second interconnector to a level less than 30 MHz, wherein the electrode of the display panel is brought to a ground potential through said protector and said second interconnector.

14. A driving circuit that drives a display panel having an electrode, comprising:
- a switcher connected to a ground;
- a first interconnector connected to said switcher;
- a protector connected to said ground;
- a second interconnector connected to said protector and said first interconnector; and
- a frequency reducer having a capacitive element connected in parallel with said protector that is operable to reduce a resonance frequency of an LC resonance resulting from a parasitic capacitance of said protector and an inductance component of said second interconnector, wherein the electrode of the display panel is brought to a ground potential through said protector and said second interconnector.

15. A display device, comprising:
- a display panel having an electrode; and
- a driver that drives said electrode of said display panel, said driver comprising:
  - a switcher connected to a power supply;
  - an interconnector connected to said switcher; and
  - a frequency reducer connected in parallel with said switcher that is operable to reduce a resonance frequency of an LC resonance resulting from a parasitic capacitance of said switcher and an inductance component of said interconnector, wherein a potential of said power supply is applied to said electrode of said display panel through said switcher and said interconnector.

16. A display device, comprising:
- a display panel having an electrode; and
- a driver that drives said electrode of said display panel, said driver comprising:
  - a switcher connected to a power supply;
  - an interconnector connected to said switcher; and
  - a frequency reducer having a capacitive element connected in parallel with said switcher that is operable to reduce a resonance frequency of an LC resonance resulting from a parasitic capacitance of said switcher and an inductance component of said interconnector, wherein a potential of said power supply is applied to said electrode of said display panel through said switcher and said interconnector.

17. A display device, comprising:
a display panel having an electrode; and
a driver that drives said electrode of said display panel, said driver comprising:
   a switcher connected to a ground;
   an interconnector connected to said switcher; and
   a frequency reducer connected in parallel with said switcher that is operable to reduce a resonance frequency of an LC resonance resulting from a parasitic capacitance of said switcher and an inductance component of said interconnector, wherein said electrode of said display panel is brought to a ground potential through said switcher and said interconnector.

18. A display device, comprising:
a display panel having an electrode; and
a driver that drives said electrode of said display panel, said driver comprising:
   a switcher connected to a ground;
   an interconnector connected to said switcher; and
   a frequency reducer having a capacitive element connected in parallel with said switcher that is operable to reduce a resonance frequency of an LC resonance resulting from a parasitic capacitance of said switcher and an inductance component of said interconnector, wherein said electrode of said display panel is brought to a ground potential through said switcher and said interconnector.

* * * * *